(12) United States Patent
van der Meulen et al.

(10) Patent No.: US 8,313,277 B2
(45) Date of Patent: Nov. 20, 2012

(54) SEMICONDUCTOR MANUFACTURING PROCESS MODULES

(75) Inventors: Peter van der Meulen, Newburyport, MA (US); Christopher C Kiley, Carlisle, MA (US); Patrick D. Pannese, Lynnfield, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 456 days.

(21) Appl. No.: 11/876,915

(22) Filed: Oct. 23, 2007

(65) Prior Publication Data

US 2008/0124197 A1 May 29, 2008

Related U.S. Application Data

(63) Continuation of application No. 11/681,978, filed on Mar. 5, 2007, now abandoned, which is a continuation-in-part of application No. 11/679,829, filed on Feb. 27, 2007, and a continuation-in-part of application No. 10/985,834, filed on Nov. 10, 2004.

(60) Provisional application No. 60/777,443, filed on Feb. 27, 2006, provisional application No. 60/518,823, filed on Nov. 10, 2003, provisional application No. 60/607,649, filed on Sep. 7, 2004.

(51) Int. Cl.
*B65G 49/07* (2006.01)
(52) U.S. Cl. ........................ 414/217; 414/805; 414/939
(58) Field of Classification Search .................. 414/217, 414/805, 939
See application file for complete search history.

(56) References Cited

U.S. PATENT DOCUMENTS

| | | | |
|---|---|---|---|
| 4,664,578 A | 5/1987 | Kakehi | |
| 4,722,298 A * | 2/1988 | Rubin et al. | 118/715 |
| 5,076,205 A * | 12/1991 | Vowles et al. | 118/719 |
| 5,310,410 A | 5/1994 | Begin et al. | |
| 5,405,230 A | 4/1995 | Ono et al. | |
| 5,417,537 A * | 5/1995 | Miller | 414/217 |
| 5,435,683 A | 7/1995 | Oosawa et al. | |
| 5,483,138 A | 1/1996 | Shmookler et al. | |
| 5,563,798 A | 10/1996 | Berken et al. | |
| 5,609,689 A | 3/1997 | Kato et al. | |
| 5,636,960 A | 6/1997 | Hiraki et al. | |
| 5,695,564 A | 12/1997 | Imahashi | |
| 5,706,201 A | 1/1998 | Andrews | |
| 5,900,105 A | 5/1999 | Toshima | |
| 5,917,601 A | 6/1999 | Shimazaki et al. | |
| 5,944,857 A | 8/1999 | Edwards et al. | |
| 5,980,194 A | 11/1999 | Freerks et al. | |
| 6,045,315 A | 4/2000 | Azumano et al. | |
| 6,053,687 A * | 4/2000 | Kirkpatrick et al. | 414/222.13 |
| 6,053,980 A | 4/2000 | Suda et al. | |
| 6,079,927 A | 6/2000 | Muka | |
| 6,082,950 A | 7/2000 | Altwood et al. | |
| 6,105,454 A | 8/2000 | Bacchi et al. | |
| 6,149,367 A | 11/2000 | Begin | |
| 6,198,074 B1 | 3/2001 | Savas | |
| 6,224,312 B1 | 5/2001 | Sundar | |

(Continued)

FOREIGN PATENT DOCUMENTS

EP 506045 9/1992

(Continued)

*Primary Examiner* — James Keenan
(74) *Attorney, Agent, or Firm* — Janik Marcovici; Colin C. Durham

(57) ABSTRACT

A variety of process modules are described for use in semiconductor manufacturing processes.

15 Claims, 43 Drawing Sheets

U.S. PATENT DOCUMENTS

| | | | |
|---|---|---|---|
| 6,235,634 B1 | 5/2001 | White et al. | |
| 6,312,525 B1 * | 11/2001 | Bright et al. | 118/719 |
| 6,315,512 B1 | 11/2001 | Tabrizi et al. | |
| 6,339,730 B1 | 1/2002 | Matsushima | |
| 6,405,101 B1 | 6/2002 | Johanson et al. | |
| 6,440,261 B1 * | 8/2002 | Tepman et al. | 414/222.01 |
| 6,502,054 B1 | 12/2002 | Mooring et al. | |
| 6,503,365 B1 * | 1/2003 | Kim et al. | 156/345.32 |
| 6,516,244 B1 | 2/2003 | Yoo et al. | |
| 6,519,504 B1 | 2/2003 | Soraoka et al. | |
| 6,549,825 B2 | 4/2003 | Kurata | |
| 6,697,517 B1 | 2/2004 | Hunter | |
| 6,707,545 B1 | 3/2004 | Hunter | |
| 6,721,045 B1 | 4/2004 | Hunter | |
| 6,742,977 B1 | 6/2004 | Okayama et al. | |
| 6,742,980 B2 | 6/2004 | Sasaki | |
| 6,788,935 B1 | 9/2004 | McKenna et al. | |
| 6,813,032 B1 | 11/2004 | Hunter | |
| 6,827,788 B2 | 12/2004 | Takahashi | |
| 6,845,292 B2 | 1/2005 | Sha et al. | |
| 6,856,858 B2 | 2/2005 | Kurita | |
| 6,979,165 B2 | 12/2005 | Larson et al. | |
| 7,012,684 B1 | 3/2006 | Hunter | |
| 7,198,448 B2 | 4/2007 | Ozawa et al. | |
| 7,331,751 B2 | 2/2008 | Tamura | |
| 7,387,484 B2 | 6/2008 | Ho et al. | |
| 7,599,691 B1 | 10/2009 | Mitchell | |
| 7,622,006 B2 | 11/2009 | Ishizawa et al. | |
| 7,905,960 B2 | 3/2011 | Choi et al. | |
| 7,959,395 B2 * | 6/2011 | Hofmeister et al. | 414/217 |
| 2001/0002358 A1 | 5/2001 | Hempel et al. | |
| 2001/0048867 A1 | 12/2001 | Lebar et al. | |
| 2002/0131848 A1 | 9/2002 | Kurata | |
| 2002/0192056 A1 | 12/2002 | Reimer et al. | |
| 2003/0035705 A1 | 2/2003 | Johnson | |
| 2003/0131458 A1 * | 7/2003 | Wang et al. | 29/25.01 |
| 2003/0168173 A1 | 9/2003 | Tamura | |
| 2004/0013497 A1 | 1/2004 | Shirai | |
| 2004/0069225 A1 | 4/2004 | Fairbairn et al. | |
| 2004/0105737 A1 | 6/2004 | Ozawa et al. | |
| 2004/0221871 A1 | 11/2004 | Fletcher et al. | |
| 2005/0118000 A1 | 6/2005 | Kasai et al. | |
| 2006/0241813 A1 | 10/2006 | Babu et al. | |
| 2006/0246683 A1 | 11/2006 | Pan et al. | |
| 2007/0071581 A1 | 3/2007 | Gilchrist et al. | |
| 2007/0073430 A1 | 3/2007 | Govind et al. | |
| 2007/0147979 A1 | 6/2007 | Rice et al. | |
| 2008/0147333 A1 | 6/2008 | van der Meulen et al. | |

FOREIGN PATENT DOCUMENTS

| | | |
|---|---|---|
| EP | 0506045 | 9/1992 |
| EP | 597637 | 5/1994 |
| EP | 0597637 A1 * | 5/1994 |

* cited by examiner

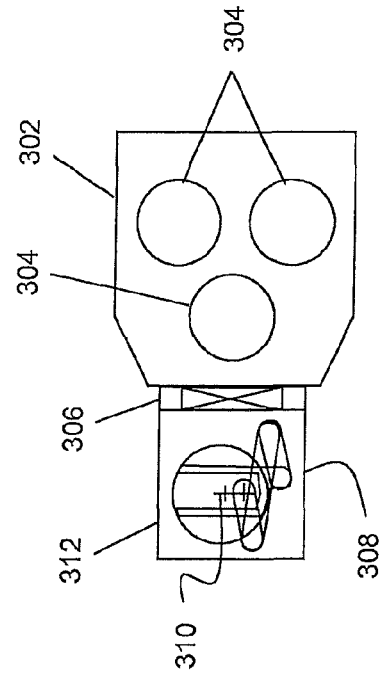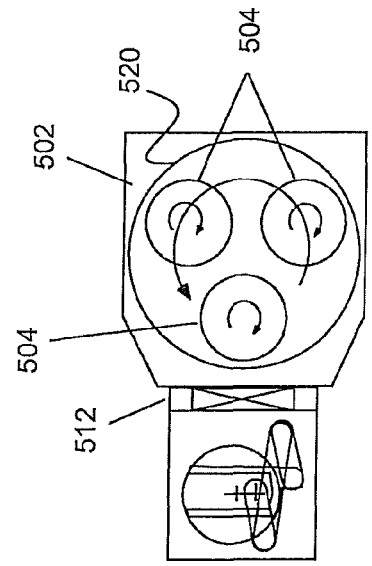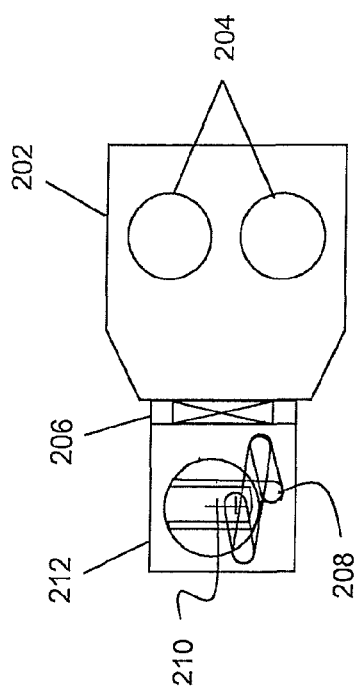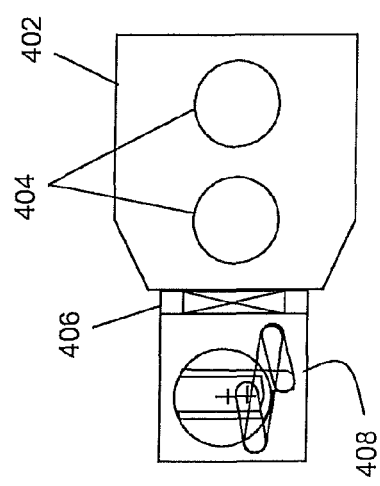

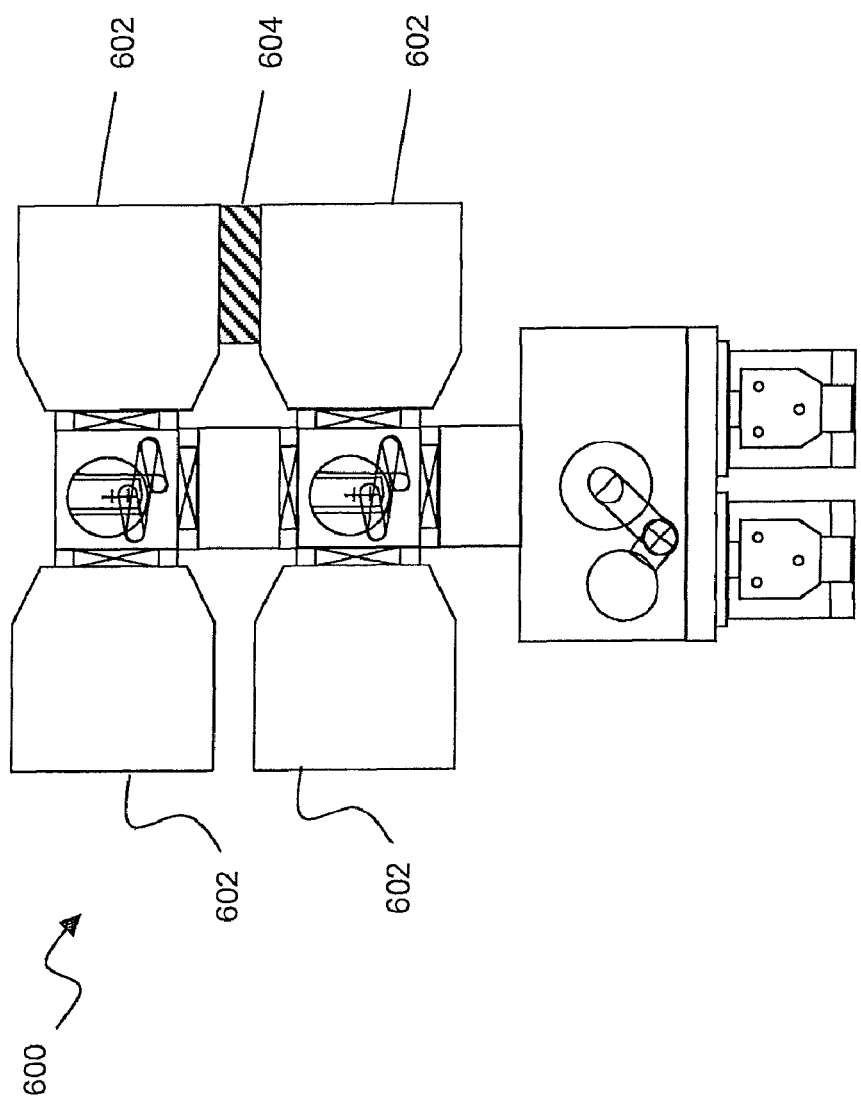

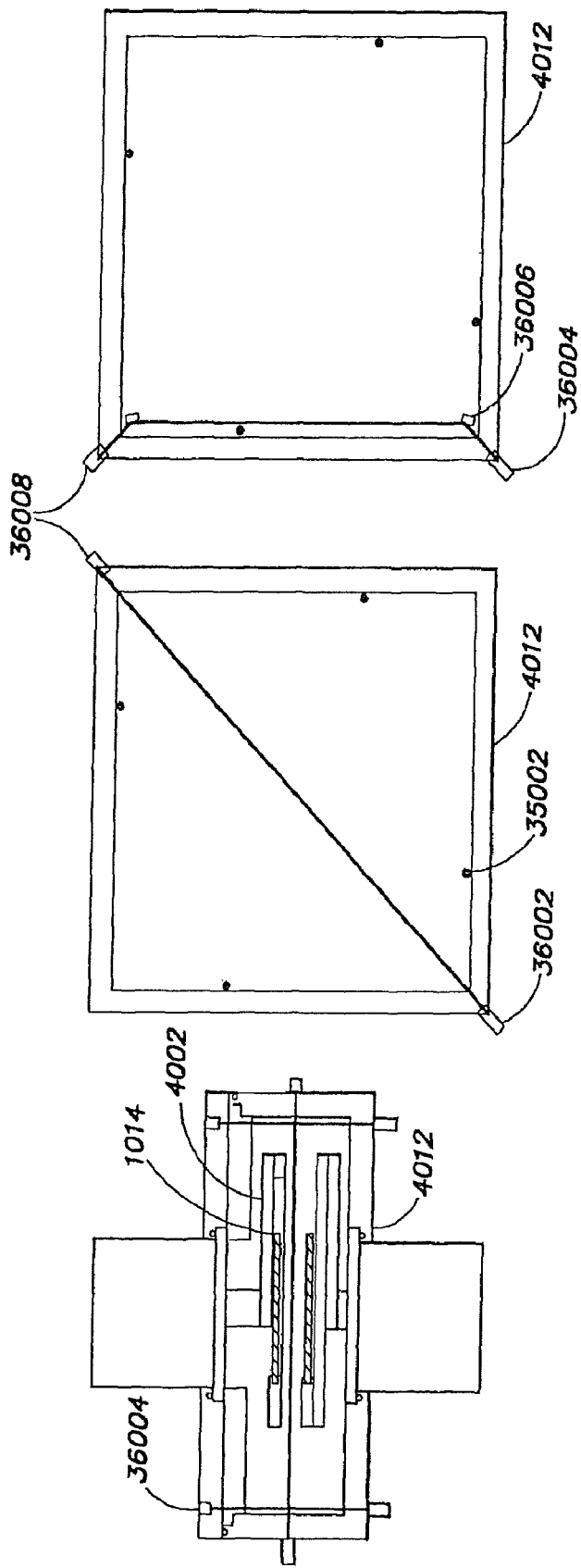

SEMICONDUCTOR MANUFACTURING PROCESS MODULES

CROSS-REFERENCE TO RELATED APPLICATIONS

This application is a continuation-in-part of U.S. application Ser. No. 11/681,978 filed on Mar. 5, 2007, now abandoned which continuation-in-part of U.S. application Ser. No. 11/679,829 filed on Feb. 27, 2007, which claims the benefit of U.S. Prov. App. No. 60/777,443 filed on Feb. 27, 2006. U.S. application Ser. No. 11/681,978 is also a continuation-in-part of U.S. application Ser. No. 10/985,834 filed on Nov. 10, 2004 which claims the benefit of U.S. Prov. App. No. 60/518,823 filed on Nov. 10, 2003 and U.S. Prov. App. No. 60/607,649 filed on Sep. 7, 2004.

This application also claims the benefit of the following U.S. applications: U.S. Prov. App. No. 60/779,684 filed on Mar. 5, 2006; U.S. Prov. App. No. 60/779,707 filed on Mar. 5, 2006; U.S. Prov. App. No. 60/779,478 filed on Mar. 5, 2006; U.S. Prov. App. No. 60/779,463 filed on Mar. 5, 2006; U.S. Prov. App. No. 60/779,609 filed on Mar. 5, 2006; U.S. Prov. App. No. 60/784,832 filed on Mar. 21, 2006; U.S. Prov. App. No. 60/746,163 filed on May 1, 2006; U.S. Prov. App. No. 60/807,189 filed on Jul. 12, 2006; and U.S. Prov. App. No. 60/823,454 filed on Aug. 24, 2006.

All of the foregoing applications are commonly owned, and all of the foregoing applications are incorporated herein by reference.

BACKGROUND

1. Field

The invention herein disclosed generally relates to semiconductor processing systems in a vacuum environment, and specifically relates to configurations of handling and process chambers for semiconductor processing in a vacuum environment.

2. Description of the Related Art

In a conventional semiconductor manufacturing system, a number of different process modules are interconnected within a vacuum or other environment and controlled to collectively process semiconductor wafers for various uses. The complexity of these manufacturing systems continues to grow both due to the increased complexity of processing larger wafers with smaller features, and due to the increasing possibilities for using a single system for several different end-to-end processes, as described for example in commonly-owned U.S. application Ser. No. 11/679,829 filed on Feb. 27, 2007. As the complexity of a fabrication system grows, it becomes increasingly difficult to schedule resources within the system in a manner that maintains good utilization of all the various process modules. While a part of this difficulty flows from the complexity of the processing recipe itself, another part of the difficulty comes from the differences in processing time for various processing steps. The generally high acquisition and operating costs of production semiconductor vacuum processing systems dictate high utilization of the handling, processing, and other modules within the systems.

Within a family of similar semiconductor products, or within a range of families within a technology, at least some of the processing steps may be commonly applied to all wafers. However, because of the unique processing requirements to achieve the final semiconductor device, sharing common processing steps may be very difficult with fixed processing systems. While it may be possible to share these common process steps by configuring them as separate machines, every machine-to-machine transfer imposes time delays and risks of contamination As a result, duplication of equipment, and the resulting underutilization of the equipment, is a common challenge with semiconductor vacuum processing operation in a semiconductor fabrication facility.

There remains a need for process modules adapted to current semiconductor manufacturing needs, and in particular, for process modules that can help to balance load, increase throughput, and improve utilization within complex processing systems.

SUMMARY

A variety of process modules are described for use in semiconductor manufacturing processes.

In one aspect, a device disclosed herein includes a single entry shaped and sized for passage of a single wafer; an interior chamber adapted to hold a plurality of wafers in a side-by-side configuration; a slot valve operable to selectively isolate the interior chamber; and a tool for processing the plurality of wafers within the interior chamber.

The plurality of wafers may consist of two wafers. The two wafers may be equidistant from the single entry. The two wafers may be in line with the single entry. The plurality of wafers may consist of three entries. The plurality of wafers may be arranged in a triangle. The device may include a wafer handler within the interior chamber, the wafer handler rotatable to position one of the plurality of wafers nearest to the single entry. The tool may process one of the plurality of wafers at a time. The device may include a single robotic arm adapted to place or retrieve any one of the plurality of wafers within the interior chamber.

In another aspect, a device disclosed herein includes an interior chamber adapted to hold a plurality of wafers; a first entry to the interior chamber shaped and size for passage of a single wafer and selectively isolated with a first slot valve; a second entry to the interior chamber shaped and size for passage of a single wafer and selectively isolated with a second slot valve; and a tool for processing the plurality of wafers within the interior chamber.

The first entry and the second entry may be positioned for access by two robotic arms positioned for a robot-to-robot hand off. The first entry and the second entry may be positioned for access by two robotic arms having center axes spaced apart by less than twice a wafer diameter. The first entry and the second entry may be positioned for access by two adjacent robotic arms positioned for hand off using a buffer location. The device may include two robotic arms, each one of the robotic arms positioned to access one of the first and second entries, and the robotic arms operable to concurrently place at least two wafers into the interior chamber substantially simultaneously. The device may include two robotic arms and a buffer sharing a common isolation environment, each one of the robotic arms positioned to access one of the first and second entries and adapted to transfer one of the plurality of wafers to the other one of the robotic arms using the buffer. The device may include a third entry to the interior chamber shaped and size for passage of a single wafer and selectively isolated with a third slot valve.

In another aspect, a device disclosed herein includes an entry shaped and size for passage of at least one wafer, the entry having a width substantially larger than the diameter of the at least one wafer; an interior chamber adapted to hold a plurality of wafers; a slot valve operable to selectively isolate the interior of the chamber; and a tool for processing the plurality of wafers within the interior chamber.

The entry may be adapted to accommodate linear access by a robot to a plurality of wafers within the interior chamber. The entry may have a width at least twice the diameter of one of the plurality of wafers.

In another aspect, a device disclosed herein includes a first entry shaped and sized for passage of a wafer; a first interior accessible through the first entry; a first slot valve operable to selectively isolate the first interior; a second entry shaped and sized for passage of the wafer; a second interior accessible through the second entry; and a second slot valve operable to selectively isolate the second interior.

The device may include a robotic arm adapted to access the first interior and the second interior. The robotic arm may include a four-link SCARA arm. The device may include two robotic arms, including a first robotic arm adapted to access the first interior and a second robotic arm adapted to access the second interior. The first robotic arm and the second robotic arm may be separated by a buffer station. The first interior may include a vacuum sub-chamber adapted for independent processing of wafers. The second interior may include a second vacuum sub-chamber having a different processing tool than the first interior. The second interior may be separated from the first interior by a wall. The first entry and the second entry may be substantially coplanar. The first entry may form a first plane angled to a second plane formed by the first entry. The device may include a robotic arm adapted to access the first entry and the second entry, wherein the first plane and the second plane are substantially normal to a line through a center axis of the robotic arm. The device may include a third entry shaped and sized for passage of a wafer, a third interior accessible through the third entry, and a third slot valve operable to selectively isolate the third interior.

In another aspect, a device disclosed herein includes a first entry shaped and sized for passage of a wafer; an interior chamber adapted to hold a wafer; a second entry shaped and sized for passage of the wafer, the second entry on an opposing side of the interior chamber from the first entry; a slot valve at each of the first and second entries, the slot valves operable to selectively isolate the interior chamber; and a tool for processing the wafer within the interior chamber.

The devices disclosed herein may be combined in various ways within a semiconductor fabrication system, for example to form fabrication facilities adapted to balance processing load among relatively fast and relatively slow processes, or between processes amenable to batch processing and processes that are dedicated to a single wafer.

In one aspect, a system disclosed herein includes a plurality of process modules coupled together to form a vacuum environment, the plurality of process modules including at least one process module selected from the group consisting of an in-line process module, a dual-entry process module, and a wide-entry process module; one or more robot handlers within the vacuum environment adapted to transfer wafers among the plurality of process modules; and at least one load lock adapted to transfer wafers between the vacuum environment and an external environment.

The system may include at least one multi-wafer process module having an entry shaped and sized for passage of a single wafer.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures:

FIG. 2 shows a multi-wafer process module.

FIG. 3 shows a multi-wafer process module.

FIG. 4 shows a multi-wafer process module.

FIG. 5 shows a multi-wafer process module.

FIG. 6 shows adjacent process modules sharing a controller.

FIGS. 23A, 23B and 23C illustrate a fabrication facility in a cross-sectional side view showing optical beam paths and alternatives beam paths.

FIG. 39 shows movement of the empty carrier in the return system of. FIG. 34 into a load lock position.

DETAILED DESCRIPTION

Figure 1:
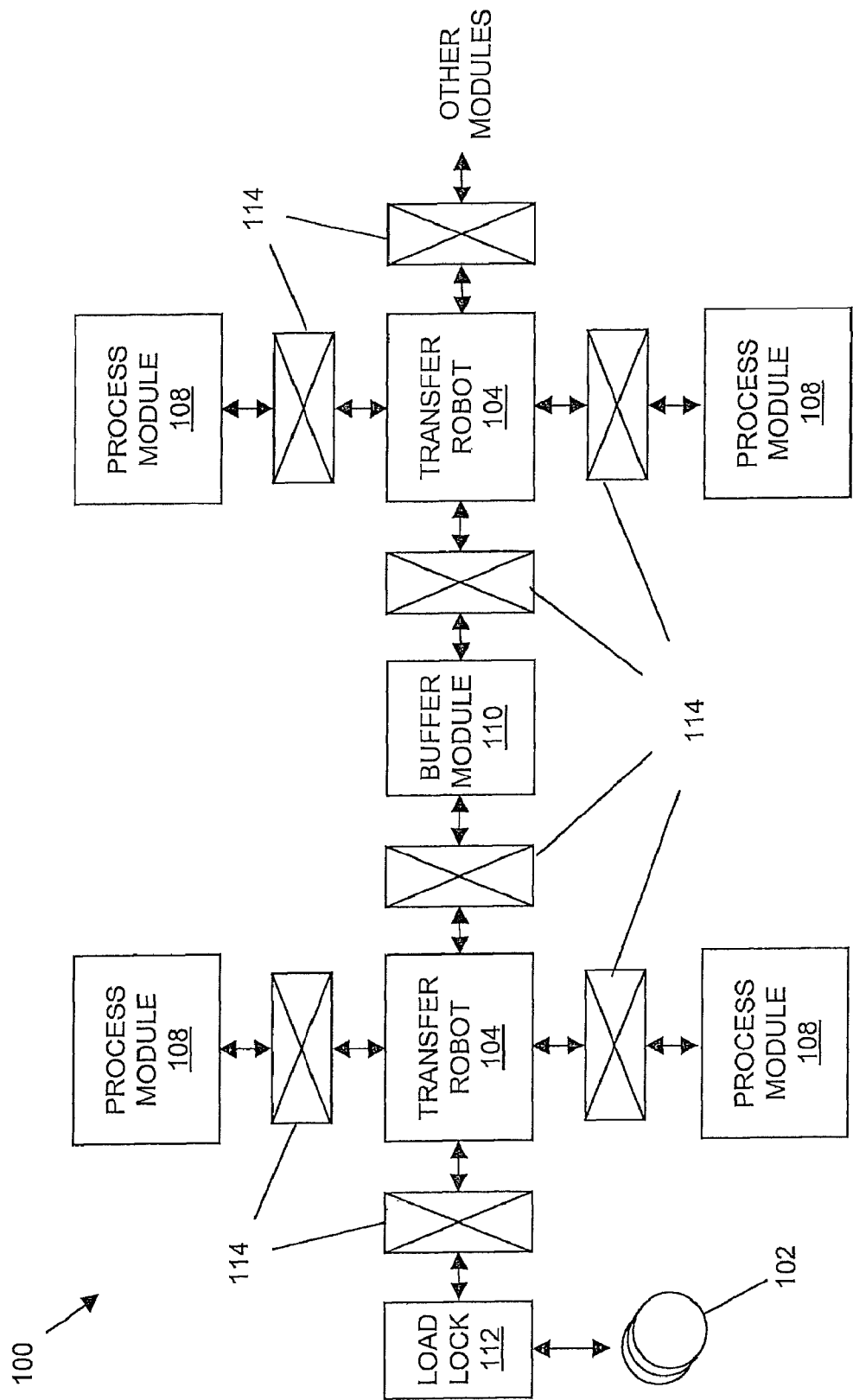
FIG. 1 depicts a generalized layout of a vacuum semiconductor manufacturing system.

FIG. 1 shows a generalized layout of a semiconductor manufacturing system. The system 100 may include one or more wafers 102, a load lock 112, one or more transfer robots 104, one or more process modules 108, one or more buffer modules 110, and a plurality of slot valves 114 or other isolation valves for selectively isolated chambers of the system 100, such as during various processing steps. In general operation, the system 100 operates to process wafers for use in, for example, semiconductor devices.

Wafers 102 may be moved from atmosphere to the vacuum environment through the load lock 112 for processing by the process modules 108. It will be understood that, while the following description is generally directed to wafers, a variety of other objects may be handled within the system 100 including a production wafer, a test wafer, a cleaning wafer, a calibration wafer, or the like, as well as other substrates (such as for reticles, magnetic heads, flat panels, and the like), including square or rectangular substrates, that might usefully be processed in a vacuum or other controlled environment. All such workpieces are intended to fall within the scope of the term "wafer" as used herein unless a different meaning is explicitly provided or otherwise clear from the context.

The transfer robots 104, which may include robotic arms and the like, move wafers within the vacuum environment such as between process modules, or to and from the load lock 112.

The process modules 108 may include any process modules suitable for use in a semiconductor manufacturing process. In general, a process module 108 includes at least one tool for processing a wafer 102, such as tools for epitaxy, chemical vapor deposition, physical vapor deposition, etching, plasma processing, lithography, plating, cleaning, spin coating, and so forth. In general, the particular tool or tools provided by a module 108 are not important to the systems and methods disclosed herein, except to the extent that particular processes or tools have physical configuration requirements that constrain the module design 108 or wafer handling. Thus, in the following description, references to a tool or process module will be understood to refer to any tool or process module suitable for use in a semiconductor manufacturing process unless a different meaning is explicitly provided or otherwise clear from the context.

Various process modules 108 will be described below. By way of example and not limitation, the process modules 108 may have various widths, such as a standard width, a double-wide width, a stretched width, or the like. The width may be selected to accommodate other system components, such as two side-by-side transfer robot modules, two transfer robot modules separated by a buffer module, two transfer robot modules separated by a transfer station, or the like. It will be understood that the width may instead be selected to accommodate more robots, such as three robots, four robots, or more, either with or without buffers and/or transfer stations. In addition, a process module 108 may accommodate a plurality of vacuum sub-chamber modules within the process module 108, where access to the vacuum sub-chamber modules may be from a plurality of transfer robot modules through a plurality of isolation valves. Vacuum sub-chamber modules may also accommodate single wafers or groups of wafers. Each sub-chamber module may be individually controlled, to accommodate different processes running in different vacuum sub-chamber modules.

A number of buffer modules 110 may be employed in the system 100 to temporarily store wafers 102, or facilitate transfer of wafers 102 between robots 104. Buffer modules 110 may be placed adjacent to a transfer robot module 104, between two transfer robot modules 104, between a transfer robot module 104 and an equipment front-end module ("EFEM"), between a plurality of robots 104 associated with modules, or the like. The buffer module 110 may hold a plurality of wafers 102, and the wafers 102 in the buffer module 110 may be accessed individually or in batches. The buffer module 110 may also offer storage for a plurality of wafers 102 by incorporating a work piece elevator, or multi-level shelving (with suitable corresponding robotics). Wafers 102 may undergo a process step while in the buffer module 110, such as heating, cooling, cleaning, testing, metrology, marking, handling, alignment, or the like.

The load lock 112 permits movement of wafers 102 into and out of the vacuum environment. In general, a vacuum system evacuates the load lock 112 before opening to a vacuum environment in the interior of the system, and vents the load lock 112 before opening to an exterior environment such as the atmosphere. The system 100 may include a number of load locks at different locations, such as at the front of the system, back of the system, middle of the system, and the like. There may be a number of load locks 112 associated with one location within the system, such as multiple load locks 112 located at the front of the linear processing system. In addition, front-end load locks 112 may have a dedicated robot and isolation valve associated with them for machine assisted loading and unloading of the system. These systems, which may include EFEMs, front opening unified pods ("FOUPs"), and the like, are used to control wafer movement of wafers into and out of the vacuum processing environment.

The isolation valves 114 are generally employed to isolate process modules during processing, or to otherwise isolate a portion of the vacuum environment from other interior regions. Isolation valves 114 may be placed between other components to temporarily isolate the environments of the system 100, such as the interior chambers of process modules 108 during wafer processing. An isolation valve 114 may open and close, and provide a vacuum seal when closed. Isolation valves 114 may have a variety of sizes, and may control entrances that are serviced by one or more robots. A number of isolation valves 114 are described in greater detail below.

Other components may be included in the system 100. For example, the system 100 may include a scanning electron microscope module, an ion implantation module, a flow through module, a multifunction module, a thermal bypass module, a vacuum extension module, a storage module, a transfer module, a metrology module, a heating or cooling station, or any other process module or the like. In addition these modules may be vertically stacked, such as two load locks stacked one on top of the other, two process modules stacked one on top of the other, or the like.

It will be understood that, while FIG. 1 shows a particular arrangement of modules and so forth, that numerous combinations of process modules, robots, load locks, buffers, and the like may suitably be employed in a semiconductor manufacturing process. The components of the system 100 may be changed, varied, and configured in numerous ways to accommodate different semiconductor processing schemes and customized to adapt to a unique function or group of functions. All such arrangements are intended to fall within this description. In particular, a number of process modules are described below that may be used with a semiconductor processing system such as the system 100 described with reference to FIG. 1.

FIG. 2 shows a multi-wafer process module. The module 202 may include a processing tool (not shown) for processing wafers 204 disposed in an interior thereof. Access to the interior may be through an entry 206 that includes an isolation valve or the like operable to selectively isolate the interior of the module 202. A robot 208 may be positioned outside the entry 206, and adapted to place wafers 204 in the interior, or to retrieve the wafers 204 from the interior. In the embodiment of FIG. 2, the module 202 is adapted to receive two wafers 204 side by side and substantially equidistant from the entry 206 and the robot 208. In this arrangement, a clear access path is provided for the robot 208 to each wafer 204, and the symmetry may advantageously simplify design of the module 202.

In general the size of the entry 206 would be only wide enough and tall enough to accommodate a single wafer 204, along with an end effector and any other portions of the robot that must pass into the interior during handling. This size may be optimized by having the robot 208 move wafers straight through a center of the entry 206, which advantageously conserves valuable volume within the vacuum environment. However, it will be understood that the size of the wafer 204 may vary. For example, while 300 mm is a conventional size for current wafers, new standards for semiconductor manufacturing provide for wafers over 400 mm in size. Thus it will be understood that the shape and size of components (and voids) designed for wafer handling may vary, and one skilled in the art would understand how to adapt components such as the entry 206 to particular wafer dimensions. In other embodiments, the entry 206 may be positioned and sized to provide a straight-line path from the wafer's position within the module 202 and the wafer's position when at a center 210 of a chamber 212 housing the robot 208. In other embodiments, the entry 206 may be positioned and sized to provide a straight-line path from the wafer's position within the module 202 and a center axis of the robot 208 (which will vary according to the type of robotic arm employed).

FIG. 3 shows a multi-wafer process module. The module 302 typically includes one or more tools to process wafers 304 therein. As depicted, the three wafers 304 may be oriented in a triangle. The entry 306 may be shaped and sized for passage of a single wafer, or may be somewhat wider to accommodate different paths for wafer passage in and out of an interior of the module 302. It will be understood that other arrangements of three wafers 304 may be employed, including wafers spaced radially equidistant from a center 310 of a robot handling module 312, or linearly in various configurations. It will also be understood that, unless the robot 308 has z-axis or vertical movement capability, the wafer 304 closest to the entrance 306 must generally be placed in last and removed first.

FIG. 4 shows a multi-wafer process module. This module 402 positions two wafers 404 in-line with the entry 406, which may advantageously permit the robot 408 to employ a single linear motion for accessing both wafers 404.

FIG. 5 shows a multi-wafer process module. This module 502 includes a wafer handler 520 adapted to move wafers 504 within the module 502. In one embodiment, the wafer handler 520 may operate in a lazy-Suzan configuration to rotate one of the wafers 504 nearest to the entry 512. In this configuration, the wafer handler 520 may also rotate wafers 504 on the rotating handler 520 (using, for example, individual motors or a planetary gear train) to maintain rotational alignment of each wafer relative to the module 502. It will be understood that, while a rotating handler is one possible configuration for the handler 520 that advantageously provides a relatively simple mechanical configuration, other arrangements are also possible including a conveyer belt, a Ferris wheel, a vertical conveyer belt with shelves for wafers, an elevator, and so forth. In general, any mechanical system suitable for accommodating loading of multiple wafers into the module 502, and preferable systems that accommodate use of an entry 512 sized for a single wafer and/or systems that reduce the required reach of robots into the module, may be useful employed in a multi-wafer process module as described herein.

FIG. 6 shows a controller shared by a number of process modules. In a conventional system, each process module has a controller adapted specifically for control of hardware within the process module. The system 600 of FIG. 6 includes a plurality of process modules 602 which may be any of the process modules described above, and may perform identical, similar, or different processes from one another. As depicted, two of the modules 602 are placed side-by-side and share a controller 604. The controller 604 may control hardware for both of the side-by-side modules 602, and provide an interface for external access/control. In addition, sensors may be associated with the modules 602 to provide data to the controller 604, as well as to recognize when a module is attached to an integrated processing system. Using a shared controller 604, which may be a generic controller suitable for use with many different types of modules 602 or a module-specific controller, advantageously conserves space around process modules 602 permitting denser configurations of various tools, and may reduce costs associated with providing a separate controller for each process module 602. The modules 602 may also, or instead, share facilities such as a gas supply, exhaust(s), water, air, electricity, and the like. In an embodiment, the shared controller 604 may control shared facilities coupled to the modules 602.

Figure 7:
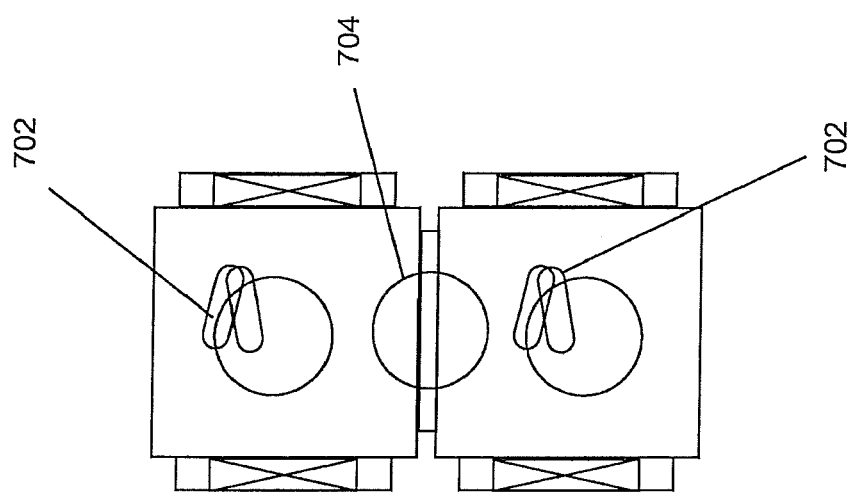
FIG. 7 shows two robotic arms sharing a buffer.

FIG. 7 shows two robotic arms sharing a buffer. In this system 700, two robots 702 transfer wafers via a buffer 704. It will be noted that no isolation valves are employed between the robots 702 and/or the buffer 704. This arrangement may advantageously reduce or eliminate the need for direct robot-to-robot hand offs (due to the buffer 704), and permit closer spacing of robots 702 because no spacing is required for isolation valves. The buffer 704 may include multiple shelves or other hardware for temporary storage of wafers. In one embodiment, the buffer 704 has a number of vertically stacked shelves, and remains stationary while robotic arms 702 move vertically to pick and place on different shelves. In another embodiment, the buffer 704 has a number of vertically stacked shelves, and the buffer 704 moves vertically to bring a specific shelf to the height of one of the robots 702. In this embodiment, each robot may have an end effector or the like with a different elevation so that both robots 702 can access the buffer 704 simultaneously without collision. In other embodiments, the end effectors of different robots 702 may have complementary shapes to accommodate simultaneous linear access, or may have offset linear positions so that fingers of each end effector do not collide when both robots 702 are accessing the buffer 704. More generally, it will be appreciated that numerous physical arrangements may be devised for a robotic system 700 that includes two or more robots 702 sharing a buffer 704 within a single isolation chamber. In other embodiments, two or more buffers 704 may also be employed. Each robot may also have multiple end effectors stacked vertically, which allows the robot to transfer multiple wafers simultaneously.

Figure 8:
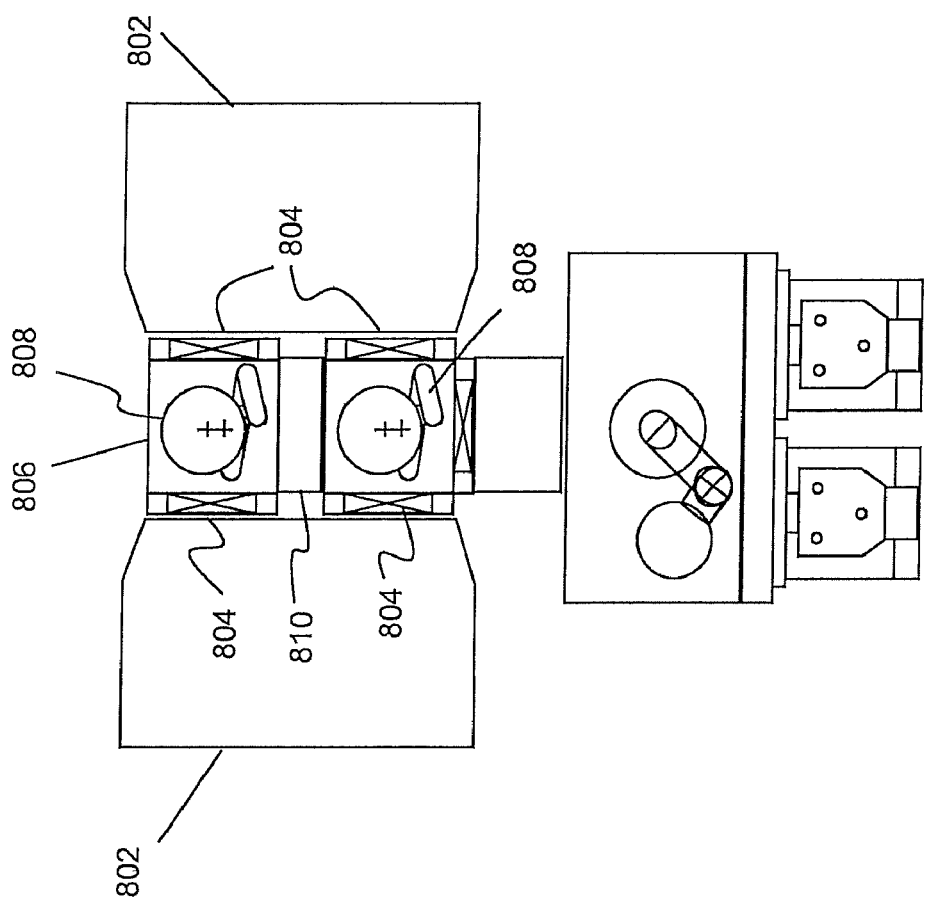
FIG. 8 shows dual entry process modules.

FIG. 8 shows a layout for dual-entry process modules. In the system 800 of FIG. 8, double-wide process modules 802 include two different entries 804, each having an isolation valve for selectively coupling an interior of the process module 802 to an external environment. As depicted, the external environment of FIG. 8 includes a single volume 806 (i.e., a shared or common environment without isolation valves) that contains two robots 808 and a buffer 810. In this embodiment, the robots 808 may hand off to one another using shelves or the like within the buffer 810, as generally described above. It will be understood that the robots 808 may also, or instead, directly hand off to one another. Each process module 802 may concurrently hold and process a number of wafers, such as two wafers, three wafers, four wafers, and so forth. It will be readily understood that two wafers may be directly accessed by the two robots 808 and entries 804, permitting parallel handling of wafers through the side-by-side entries 804. Thus, for example, two wafers (or more wafers using, e.g., batch end effectors or the like), may be simultaneously transferred from the process module 802 depicted on the left of FIG. 8 and the process module 802 depicted on the right of FIG. 8. In addition, the dual processing chamber may advantageously employ shared facilities, such as gasses, vacuum, water, electrical, and the like, which may reduce cost and overall footprint. This arrangement may be particularly useful for a module 802 having long process times (for example, in the range of several minutes) by permitting concurrent processing and/or handling of multiple wafers.

Figure 9:
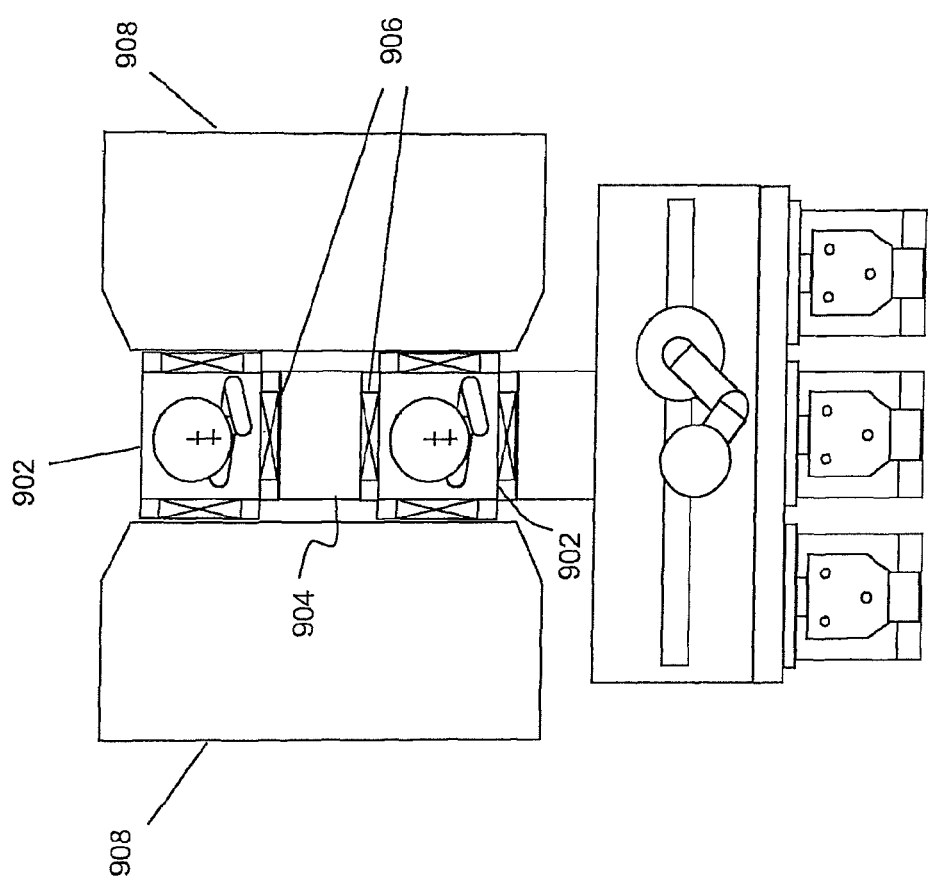
FIG. 9 shows dual entry process modules.

FIG. 9 shows a layout for a dual-entry process module. In the embodiment of FIG. 9, the robotic handlers are in chambers 902 isolated from one another by a buffer 904 with isolation valves 906. This configuration of robotics provides significant advantages. For example, the buffer 904 may be isolated to accommodate interim processing steps such as metrology or alignment, and may physically accommodate more wafers. In addition, this arrangement permits one of the robotic handlers to access a load lock/EFEM in isolation from the other robotic handler and process modules. However, this configuration requires greater separation between the robotic handlers, and requires a correspondingly wider process module 908. As noted above, various internal transport mechanisms may be provided within the process module 908 to permit movement of wafers within the module to a position close to the entry or entries. However, in some embodiments, the process module 908 may only process two wafers simultaneously.

It will be understood that the embodiments of FIGS. 8-9 may be readily adapted to accommodate three, four, or more entries with suitable modifications to entries, modules, and robotics. All such variations are intended to fall within the scope of this disclosure. As with other process modules described herein, these modules may also be readily adapted to batch processing by providing, for example, vertically stacked shelves and robots with dual or other multiple end effectors.

Figure 10:
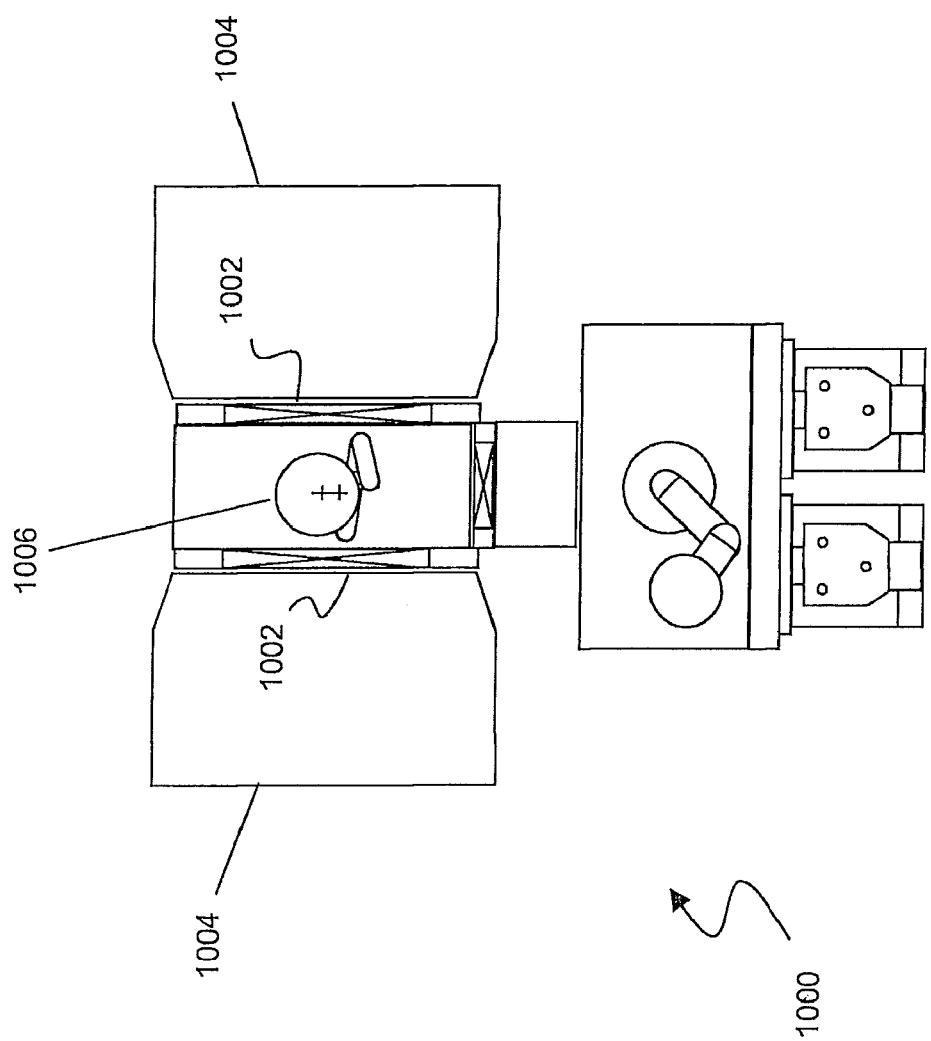
FIG. 10 shows a process module with an oversized entry.

FIG. 10 shows a process module with an over-sized entry. In the embodiment of FIG. 10, an entry 1002 to a process module 1004 may be substantially wider than the diameter of wafers handled by the system 1000. In general, the increased width of the entry 1002 and a corresponding isolation valve permits linear access by a robot 1006 to more of the space within an interior chamber of the process module 1004. In embodiments, the entry 1002 may have a width that is 50% greater than the diameter of a wafer, twice the diameter of a wafer, or more than twice the diameter of a wafer. In embodiments, the entry 1002 has a width determined by clearance for linear robotic access (with a wafer) to predetermined positions within the process module 1004, such as the corners of the module 1004 opposing the entry 1002, or other positions within the module 1004. While it is possible for robots to reach around corners and the like, linear access or substantially linear access simplifies robotic handling and requires less total length of links within a robotic arm. In one aspect, two such process modules 1004 may share a robotic handler, thereby permitting a high degree of flexibility in placement and retrieval motions for wafers among the modules 1004.

Figure 11:
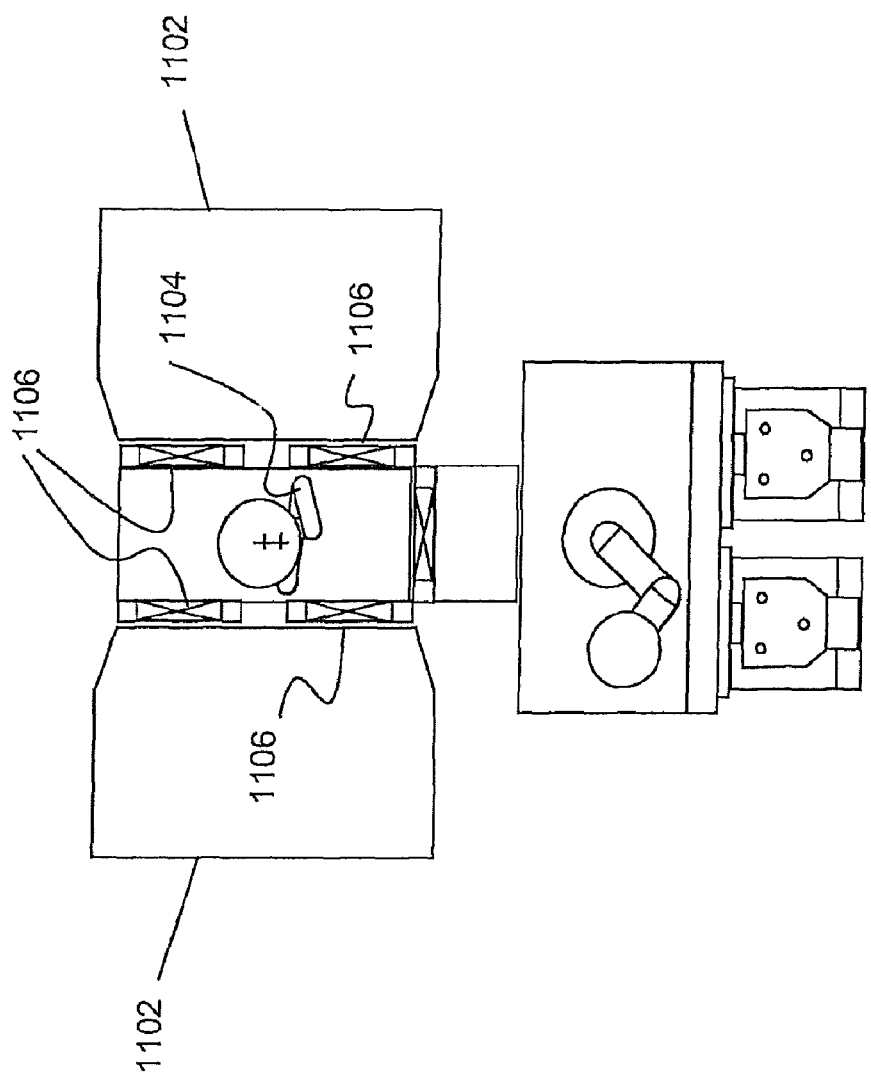
FIG. 11 shows side-by-side process modules.

FIG. 11 shows a dual entry process module. Each process module 1102 may be a dual-entry process module having two entries as described, for example with reference to FIG. 9 above. In the embodiment of FIG. 11, a single robot 1104 may service each entry 1106 of one or more of the process modules 1102. Due to the long reach requirements, the robot 1104 may include a four-link SCARA arm, a combination of telescoping and SCARA components, or any other combination of robotic links suitable for reaching into each entry 1106 to place and retrieve wafers in the process module(s) 1102.

Figure 12:
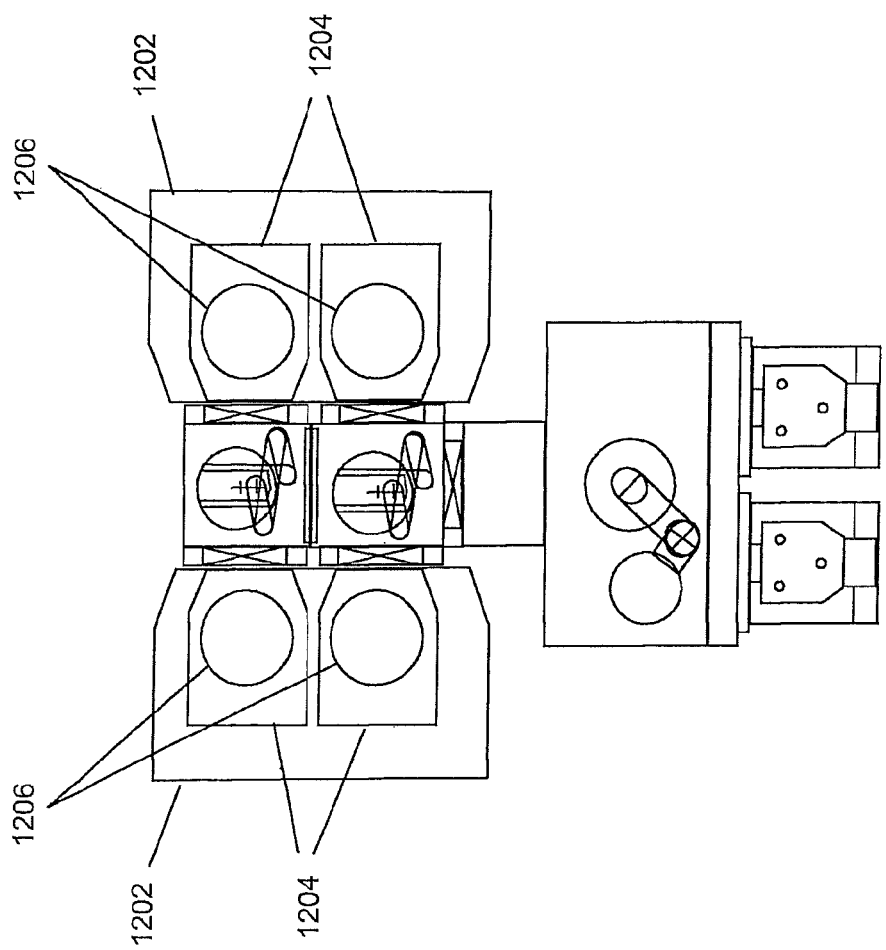
FIG. 12 shows multi-process modules.
Figure 13:
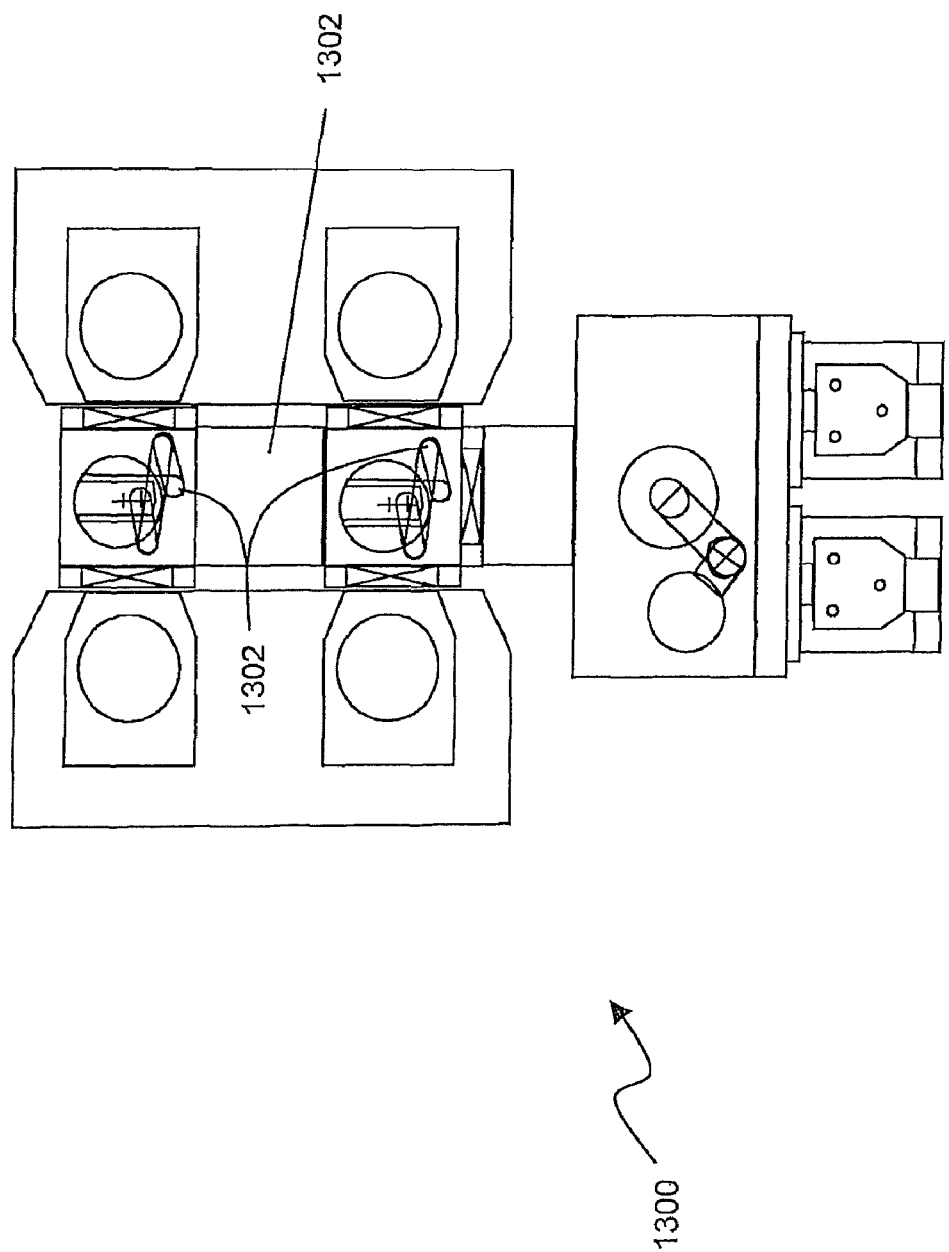
FIG. 13 shows multi-process modules.

FIG. 12 shows multi-process modules. In the embodiment of FIG. 12, a process module 1202 may include two (or more) vacuum sub-chambers 1204 for independently processing wafers 1206. Each vacuum sub-chamber 1204 may be separated from the other by a wall or similar divider that forms two isolated interiors within the module 1202. Each vacuum sub-chamber 1204 may, for example include one or more independent processing tools and an independent vacuum environment in the corresponding interior chamber selectively isolated with an isolation valve. In other embodiments, each sub-chamber 1204 may include a shared tool that independently processes each wafer 1206, so that a single environment is employed within the process module 1202 even through wafers are processed separately and/or independently. FIG. 13 shows a multi-process module system 1300 employing a buffer 1302 between robots 1304. The isolation entries and/or isolation valves may be substantially coplanar, such as to abut linearly arranged robotic handlers or other planar surfaces of handling systems.

Figure 14:
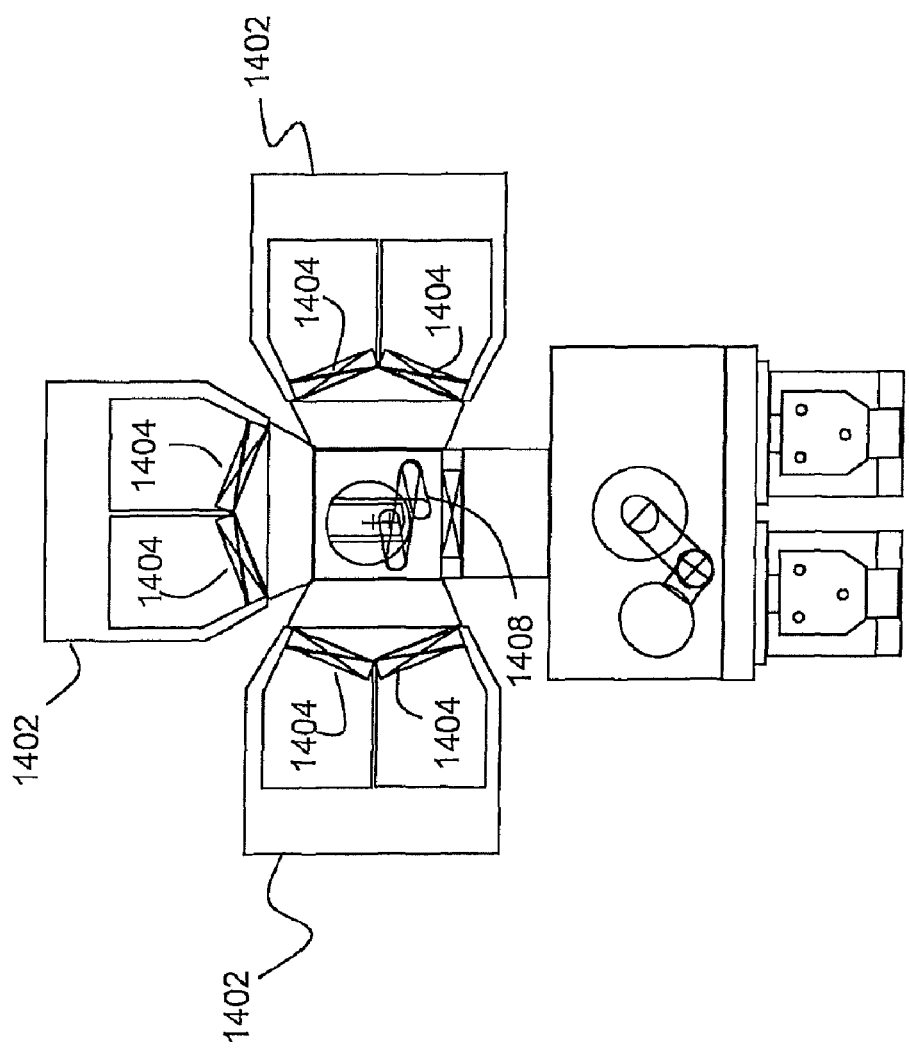
FIG. 14 shows multi-process modules.

FIG. 14 shows multi-process modules. In the embodiment of FIG. 14, each process module 1402 may include a number of entries 1404 for selective isolation of the processing environment within the process modules 1402. In this embodiment, the entries 1404 for each module 1402 form planes that are angled with respect to one another. In one embodiment, these planes are oriented substantially normal to a ray from a wafer center within the module 1402 to a center of the robotic handler 1408 or a center axis of the robotic handler 1408. This configuration provides a number of advantages. For example, in this arrangement, a single robot 1408 may have linear access to each process module 1402 sub-chamber. Further, three process modules 1402 may be arranged around a single robot 1408. As a significant advantage, this general configuration affords the versatility of a cluster tool in combination with the modularity of individual process modules. It will be understood that while FIG. 14 depicts each entry 1404 as servicing a single sub-chamber within a process module 1402, the process module 1402 may have a single, common interior where multiple wafers are exposed to a single process.

Figure 15:
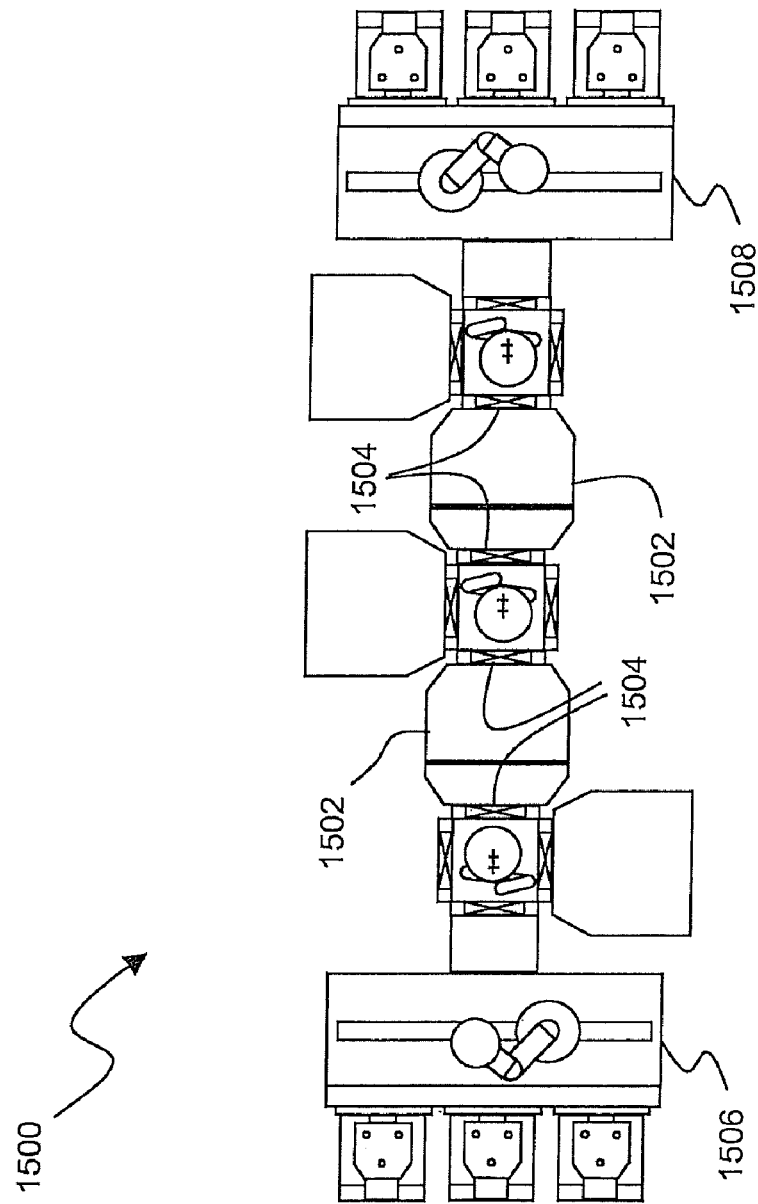
FIG. 15 shows an in-line process module in a layout.

FIG. 15 shows an in-line process module in a layout. In the system 1500, each linear process module 1502 includes two entries 1504 on substantially opposite sides of the module 1502. This configuration facilitates linear arrangements of modules by permitting a wafer to be passed into the module 1502 on one side, processed with a tool (which may be, for example, any of the tools described above, and retrieved from the module 1502 on an opposing side so that multiple linear modules 1502 and/or other modules may be linked together in a manner that effectively permits processing during transport from one EFEM 1506 (or the like) to another EFEM 1508. In one embodiment, the in-line process modules may provide processes used for all wafers in the system 1500, while the other process modules may provide optional processes used only on some of the wafers. As a significant advantage, this layout permits use of a common system for different processes having partially similar processing requirements.

In general, the embodiments depicted above may be further expanded to incorporate additional processing modules and transfer robot modules. The following figures illustrate a number of layouts using the process modules described above.

Figure 16:
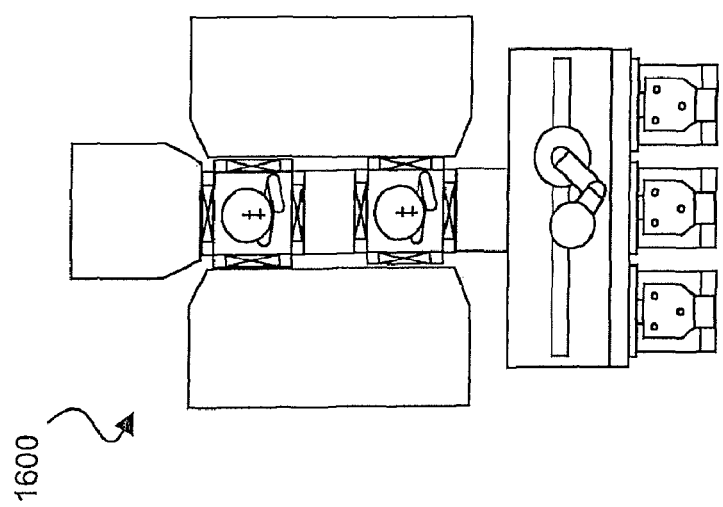
FIG. 16 shows a layout using dual entry process modules.

FIG. 16 shows a layout using dual entry process modules. In this system 1600, two dual-entry process modules share a robotic handling system with a conventional, single process module. In an example deployment, the dual-entry process modules may implement relatively long processes, while the conventional module provides a single, short process. The robotics may quickly transfer a series of wafers between the buffer and the short process module while a number of wafers are being processed in the dual entry process modules.

Figure 17:
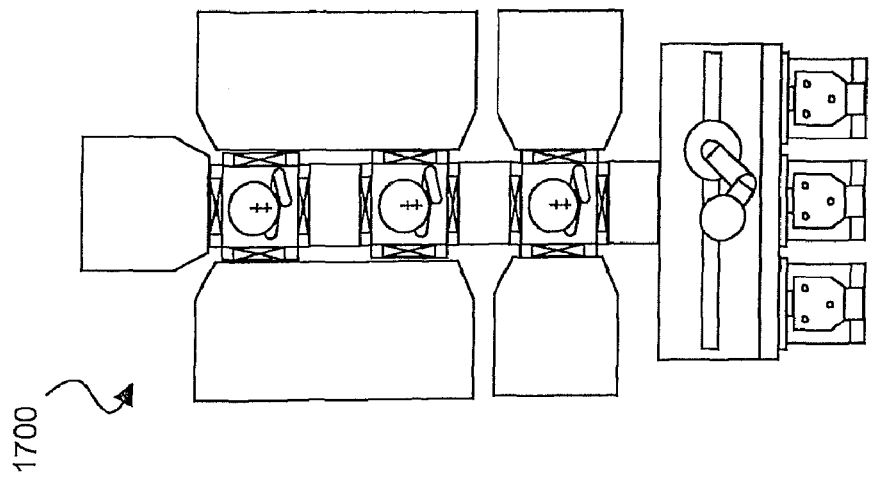
FIG. 17 shows a layout using dual entry process modules.

FIG. 17 shows a layout using dual entry process modules. In this system 1700, two additional process modules are added. This may be useful, for example, to balance the duty cycles of various process modules thereby providing higher utilization of each module, or provide for more efficient integration of relatively fast and slow processes or process modules within a single environment.

Figures 18, 19:
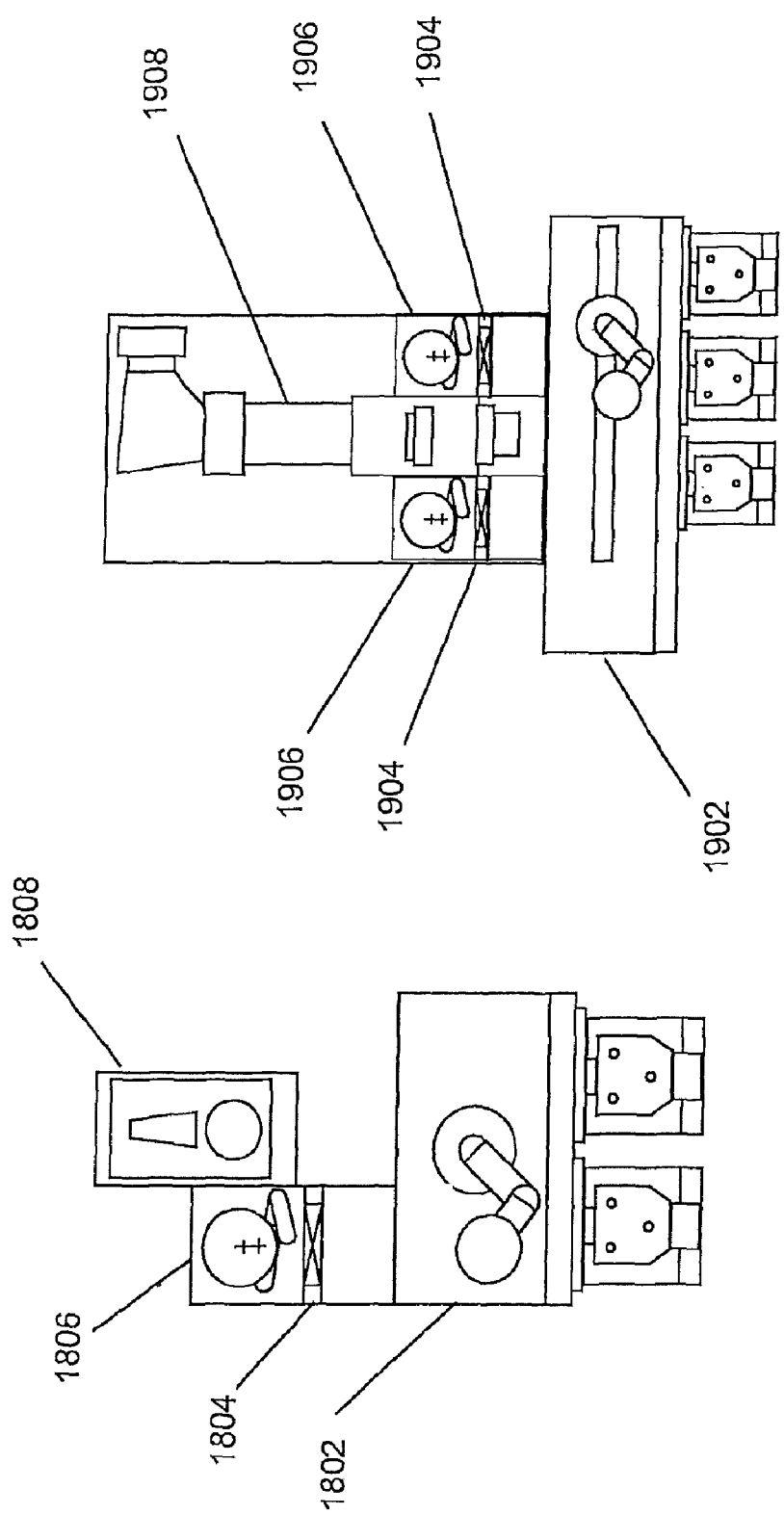
FIG. 18 shows a process module containing a scanning electron microscope.
FIG. 19 shows a process module containing an ion implantation system.

FIG. 18 shows a process module containing a scanning electron microscope. The system 1800 may include an EFEM or FOUP 1802, an entry 1804 including an isolation valve, a robotic handler 1806, and a scanning electron microscope 1808. The entry 1804 may provide selective isolation to the robotic handler 1806 and/or microscope 1808, and the robotic handler 1806 may transfer wafers between the microscope 1808 and the rest of the system 1800. This general configuration may be employed to add a scanning electron microscope to a semiconductor manufacturing system in a manner similar to any other process module, which advantageously permits microscopic inspection of wafers without removing wafers from the vacuum environment, or to add a stand-alone microscope to a vacuum environment fabrication facility FIG. 19 shows a process module containing an ion implantation system. The system 1900 may include an EFEM or FOUP 1902, an entry 1904 including an isolation valve, a robotic handler 1906, and an ion implantation system 1908. The entry 1904 may provide selective isolation to the robotic handler 1906 and/or ion implantation system 1908, and the robotic handler 1906 may transfer wafers between the ion implantation system 1908 and the rest of the system 1900. This general configuration may be employed to add an ion implantation tool to a semiconductor manufacturing system in a manner similar to any other process module, which advantageously permits ion implantation on wafers without removing wafers from the vacuum environment, or to add a stand-alone implantation system to a vacuum environment fabrication facility.

Figure 20:
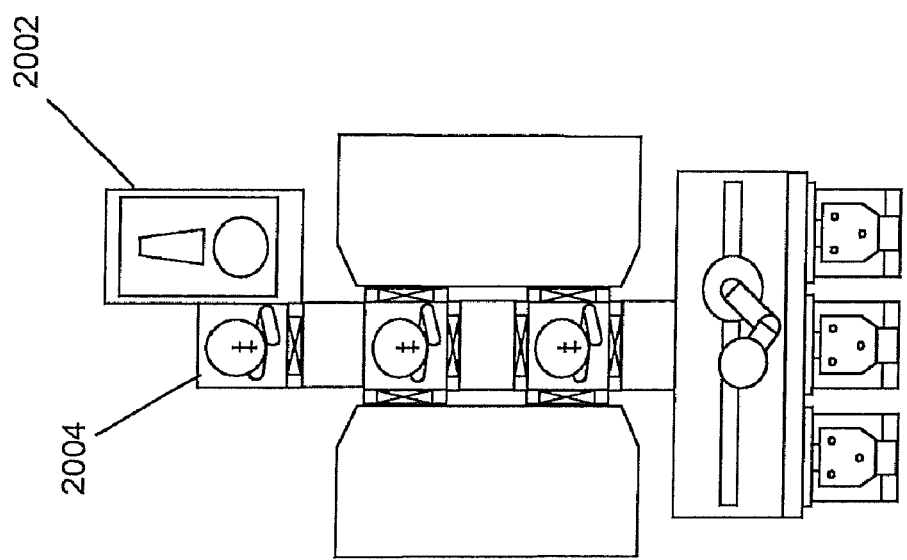
FIG. 20 shows a layout using a scanning electron microscope module.

FIG. 20 shows a layout using a scanning electron microscope module. As illustrated, the system 2000 includes a scanning electron microscope module 2002 with an integrated transfer robot 2004. This hardware is incorporated into the semiconductor processing system 2000, including additional transfer robotics, process modules, and EFEM. Such an embodiment may be useful for handling and setup of a microscopic scanning function within a vacuum processing environment, allowing the semiconductor work piece to be kept in vacuum throughout the process, including intermittent or final inspection using electron microscopy. While the illustrated system 2000 includes two dual-entry process modules as additional processing hardware, it will be understood that any suitable combination of process modules may be employed with the systems described herein.

Figure 21:
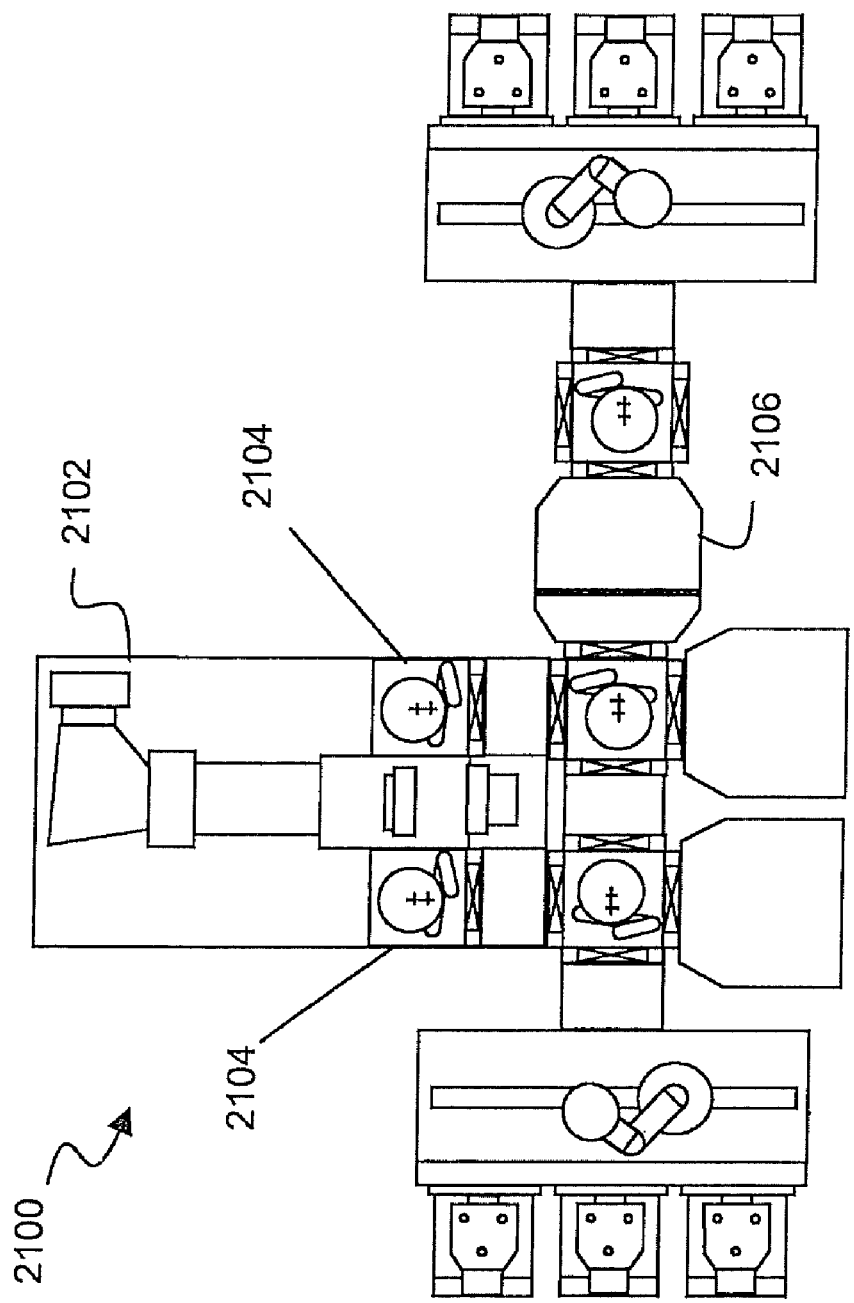
FIG. 21 shows a layout using an ion implantation module.

FIG. 21 shows a layout using an ion implantation module. As illustrated, the system 2100 includes an ion implantation system 2102 and two robotic handlers 2104. This hardware is incorporated into the semiconductor processing system 2100, which includes additional transfer robotics, process modules, and two EFEMs. Such an embodiment may be useful for handling and setup of ion implantation within a vacuum-processing environment, allowing the wafer to be kept in vacuum throughout a multi-step process that includes one or more ion implantation steps. The process system is configured such that wafers that do not require ion implantation may bypass the ion implantation system through two robots and a buffer. Such a wafer may nonetheless be processed in other process modules connected to the system 2100.

A linear process module 2106 may also be provided. This configuration may be particularly useful in high-throughput processes so that a bottleneck is avoided at either entry to or exit from the vacuum environment. In addition, the linear process module 2106 may be simultaneously or nearly simultaneously loaded from one entry while being unloaded from the other entry.

Figure 22:
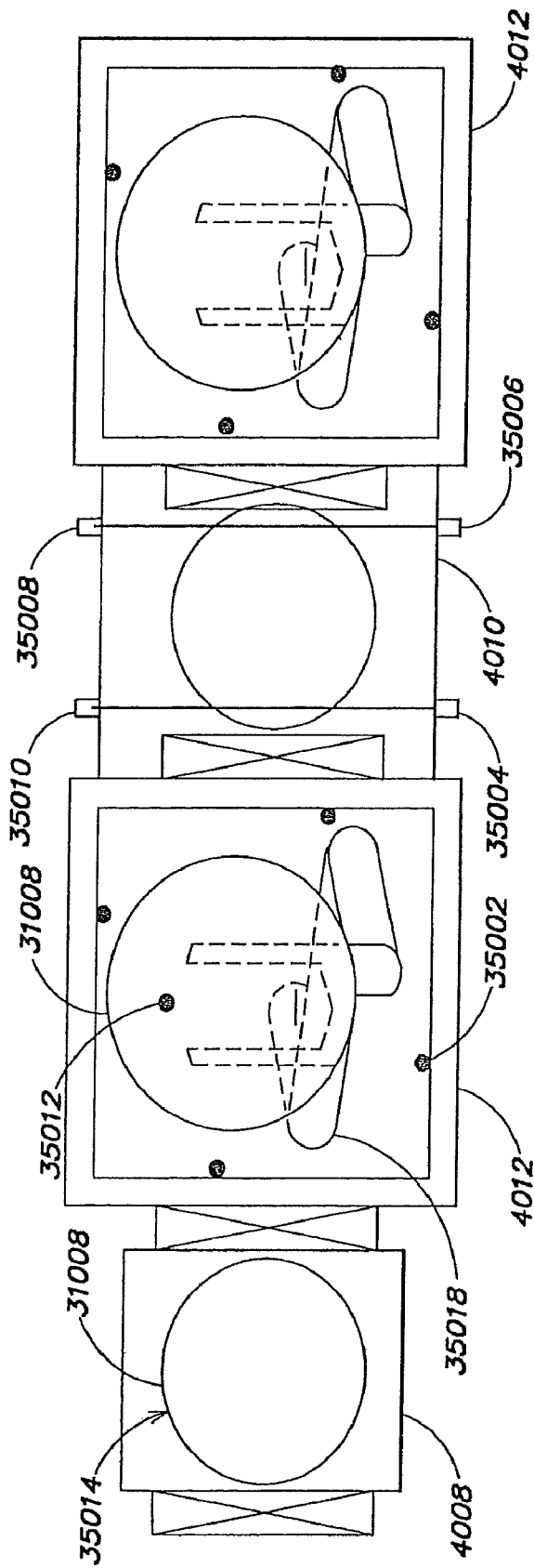
FIG. 22 illustrates a fabrication facility including the placement of optical sensors for detection of robotic arm position and materials in accordance with embodiments of the invention.

FIG. 22 illustrates a fabrication facility including a series of sensors 35002. In many fabrication facilities such sensors 35002 are commonly used to detect whether a material 35014 is still present on a robotic arm 35018. Such sensors 35002 may be commonly placed at each vacuum chamber 4012 entry and exit point. Such sensors 35002 may consist of a vertical optical beam, either employing an emitter and detector, or employing a combination emitter/detector and a reflector. In a vacuum handling facility, the training of robotic stations is commonly accomplished by a skilled operator who views the position of the robot arm and materials and adjusts the robot position to ensure that the material 35014 is deposited in the correct location. However, frequently these positions are very difficult to observe, and parallax and other optical problems present significant obstacles in properly training a robotic system. Hence a training procedure can consume many hours of equipment downtime.

Several automated training applications have been developed, but they may involve running the robotic arm into a physical obstacle such as a wall or edge. This approach has significant downsides to it: physically touching the robot to an obstacle risks damage to either the robot or the obstacle, for example many robot end effectors are constructed using ceramic materials that are brittle, but that are able to withstand very high wafer temperatures. Similarly, inside many process modules there objects that are very fragile and easily damaged. Furthermore, it may not be possible to employ these auto-training procedures with certain materials, such as a wafer 3 1008 present on the robot end effector. Moreover, the determination of vertical position is more difficult because upward or downward force on the arm caused by running into an obstacle is much more difficult to detect.

In the systems described herein, a series of sensors 35002-35010 may include horizontal sensors 35004-35010 and vertical sensors 35002. This combination of sensors 35002-35010 may allow detection, for example through optical beam breaking, of either a robotic end effector, arm, or a handled object. The vertical sensor 35002 may be placed slightly outside the area of the wafer 31008 when the robotic arm 3501 8 is in a retracted position. The vertical sensor 35002 may also, or instead, be placed in a location such as a point 35012 within the wafer that is centered in front of the entrance opening and covered by the wafer when the robot is fully retracted. In this position the sensor may be able to tell the robotic controller that it has successfully picked up a wafer 31008 from a peripheral module.

Horizontal sensors 35004-35010 may also be advantageously employed. In vacuum cluster tools, horizontal sensors 35004-35010 are sometimes impractical due to the large diameter of the vacuum chamber, which may make alignment of the horizontal sensors 35004-35010 more complicated. In the systems described above, the chamber size may be reduced significantly, thus may make it practical to include one or more horizontal sensors 35004-35010.

FIG. 23A-C illustrates other possible locations of the horizontal sensors 35004-35010 and vertical sensors 35002, such as straight across the chamber (36002 and 36008) and/or through mirrors 36006 placed inside the vacuum system.

Figures 24A, 24B:
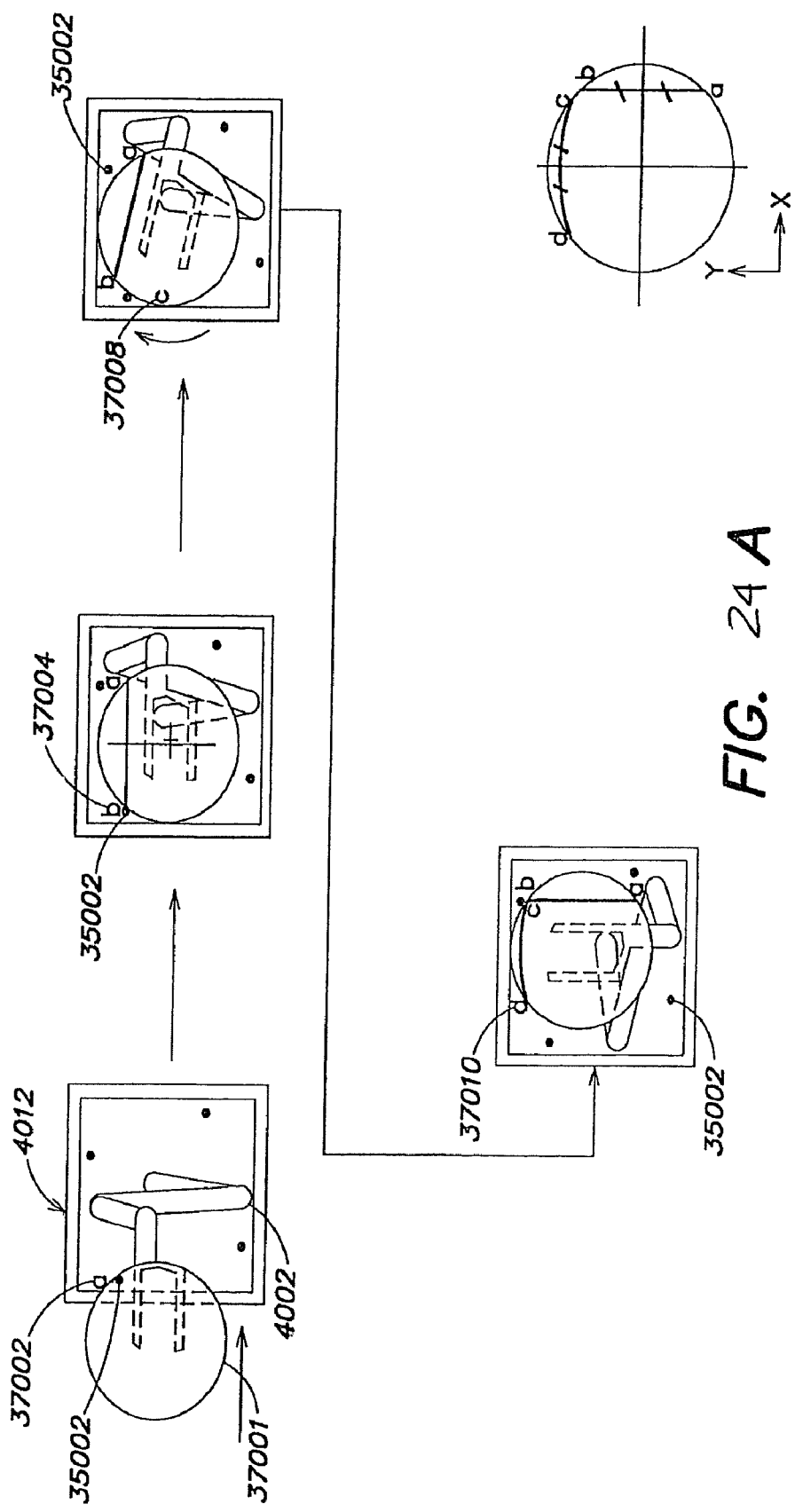
FIGS. 24A and 24B illustrate how optical sensors can be used to determine the center of the material handled by a robotic arm.

FIG. 24A-B illustrates a possible advantage of placing the sensor 35002 slightly outside the wafer 37001 radius when the robot arm is fully retracted. During a retract motion the sensor 35002 detects the leading edge of the wafer 37001 at point "a" 37002 and the trailing edge at point "b" 37004. These results may indicate that the wafer 37001 was successfully retrieved, but by tying the sensor 35002 signal to the encoders, resolvers or other position elements present in the robotic drive, one can also calculate if the wafer 37001 is centered with respect to the end effector. The midpoint of the line segment "a-b" 37002, 37004 should correspond to the center of the end effector because of the circular geometry of a wafer 37001. If the wafer 37001 slips on the end effector, inconsistent length measurements may reveal the slippage.

Additionally, during a subsequent rotation and movement, a second line segment "c-d" 37008, 37010 may be detected when the wafer 37001 edges pass through the sensor. Again, the midpoint between "c" 37008 and "d" 37010 should coincide with the center of the end effector, and may permit a measurement or confirmation of wafer centering.

The above method may allow the robot to detect the wafer 37001 as well as determine if the wafer 37001 is off-set from the expected location on the end effector.

The combination of horizontal and vertical sensors 35002-35010 may allow the system to be taught very rapidly using non-contact methods: the robotic arm and end effectors may be detected optically without the need for mechanical contact. Furthermore, the optical beams can be used during real-time wafer 37001 handling to verify that wafers 37001 are in the correct position during every wafer 37001 handling move.

Figure 25A:
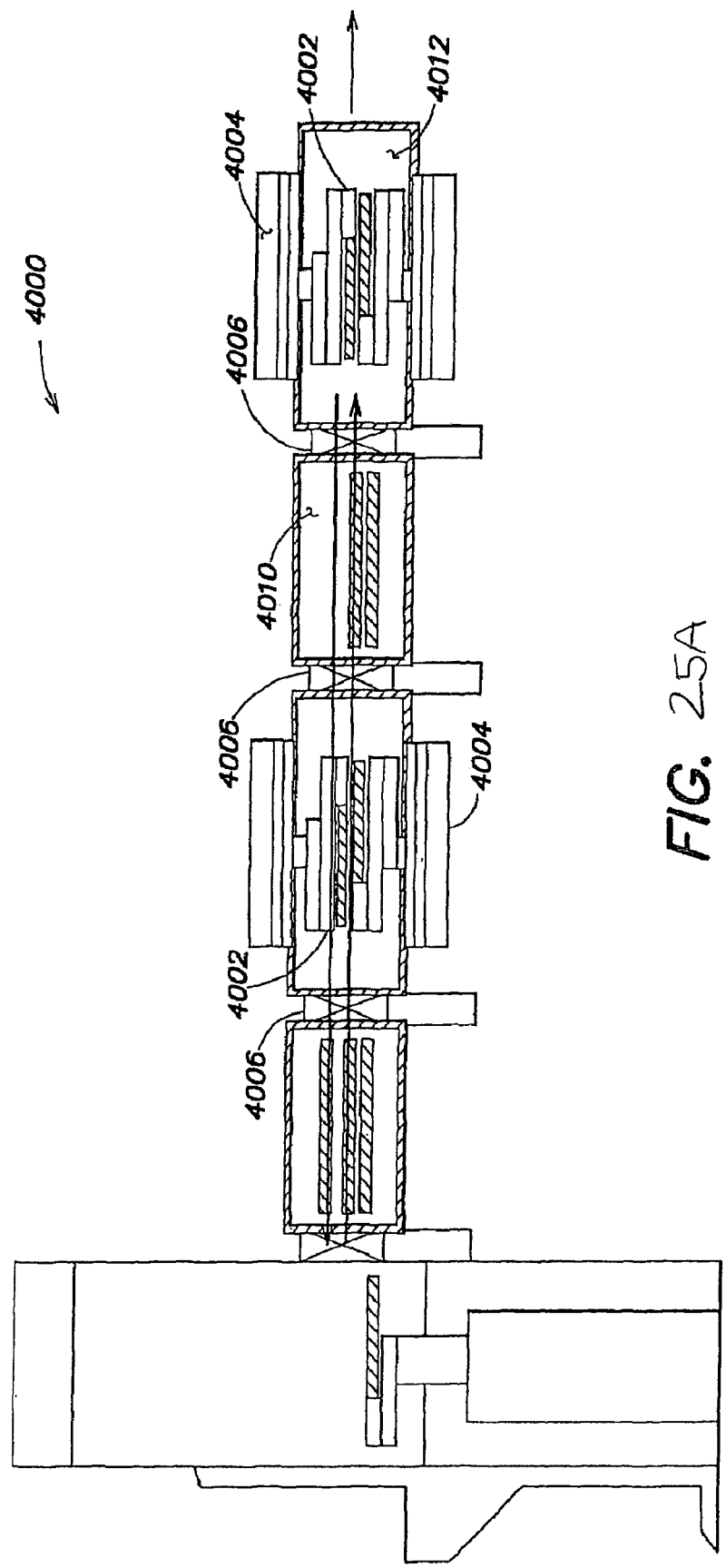
FIG. 25A shows high-level components of a linear processing architecture for handling items in a manufacturing process.

FIG. 25A shows high-level components of a linear processing architecture 4000 for handling items in a manufacturing process. The architecture uses two or more stationary robots 4002 arranged in a linear fashion. The robots 4002 can be either mounted in the bottom of the system or hang down from the chamber lid or both at the same time. The linear system uses a vacuum chamber 4012 around the robot. The system could be comprised of multiple connected vacuum chambers 4012, each with a vacuum chamber 4012 containing its own robot arranged in a linear fashion. In embodiments, a single controller could be set up to handle one or more sections of the architecture. In embodiments vacuum chambers 4012 sections are extensible; that is, a manufacturer can easily add additional sections/chambers 40 12 and thus add process capacity, much more easily than with cluster architectures. Because each section uses independent robot drives 4004 and arms 4002, the throughput may stay high when additional sections and thus robots are added. By contrast, in cluster tools, when the manufacturer adds process chambers 2002, the system increases the load for the single robot, even if that robot is equipped with a dual arm, eventually the speed of the robot can become the limiting factor. In embodiments, systems address this problem by adding additional robot arms 4002 into a single drive. Other manufacturers have used a 4-axis robot with two completely independent arms such as a dual SCARA or dual Frog-leg robots. The linear system disclosed herein may not be limited by robot capacity, since each section 4012 contains a robot, so each section 4012 is able to transport a much larger volume of material than with cluster tools.

Figure 25B:
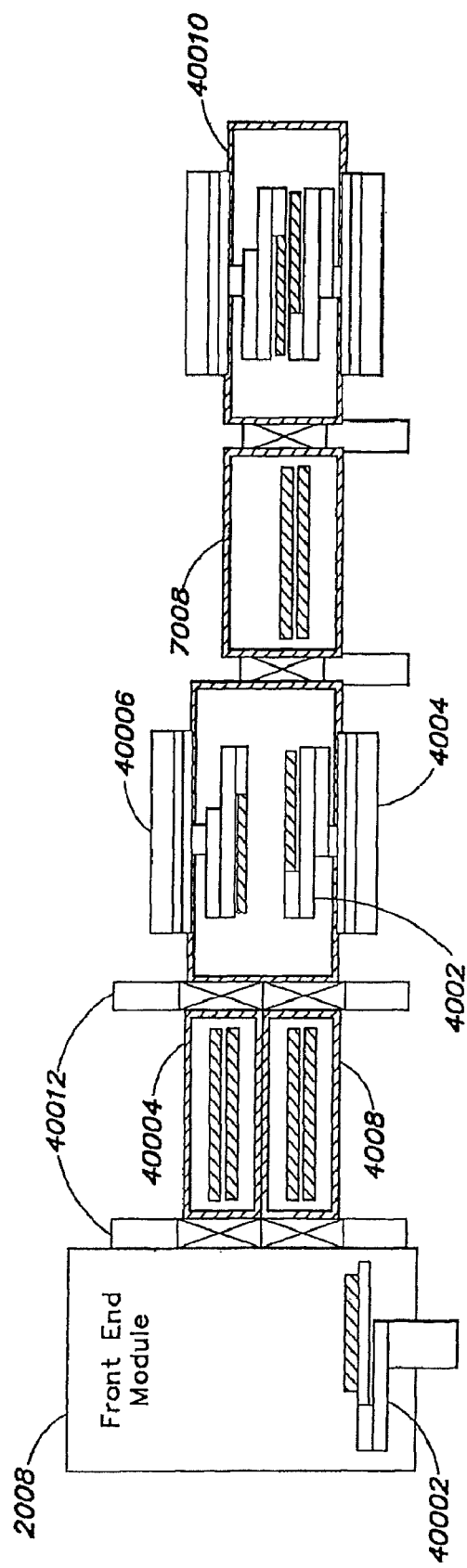
FIG. 25B illustrates a vertically arranged load lock assembly in accordance with embodiments of the invention.

FIG. 25B shows a stacked vacuum load lock 4008, 40004 for entering materials into a vacuum environment. One limiting factor on bringing wafers 31008 into a vacuum system is the speed with which the load lock can be evacuated to high vacuum. If the load lock is pumped too fast, condensation may occur in the air in the load lock chamber, resulting in precipitation of nuclei on the wafer 31008 surfaces, which can result in particles and can cause defects or poor device performance. Cluster tools may employ two load locks side by side, each of which is alternately evacuated. The pumping speed of each load lock can thus be slower, resulting in improved performance of the system. With two load locks 4008, 40004 in a vertical stack, the equipment footprint stays very small, but retains the benefit of slower pumping speed. In embodiments, the load lock 40004 can be added as an option. In embodiments the robotic arms 4004 and 40006 can each access either one of the two load locks 4008, 40004. In embodiments the remaining handoff module 7008 could be a single level handoff module.

Figure 25C:
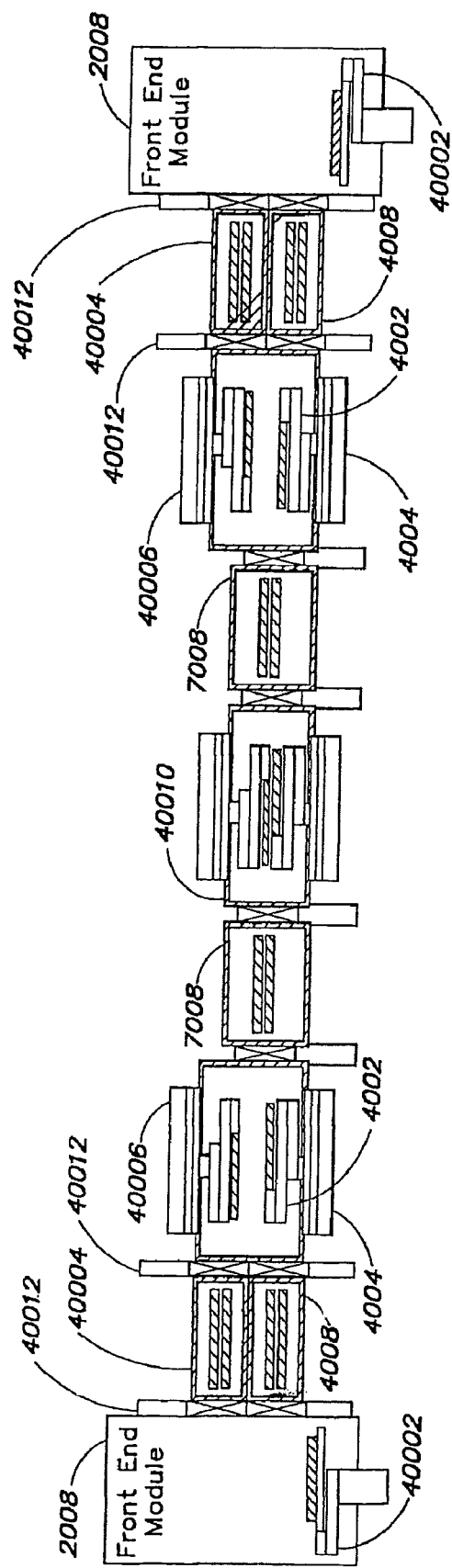
FIG. 25C illustrates a vertically arranged load lock assembly at both sides of a wafer fabrication facility in accordance with embodiments of the invention.

FIG. 25C shows another load lock layout. In this figure wafers 31008 can be entered and can exit at two levels on either side of the system, but follow a shared level in the rest of the system.

Figure 26:
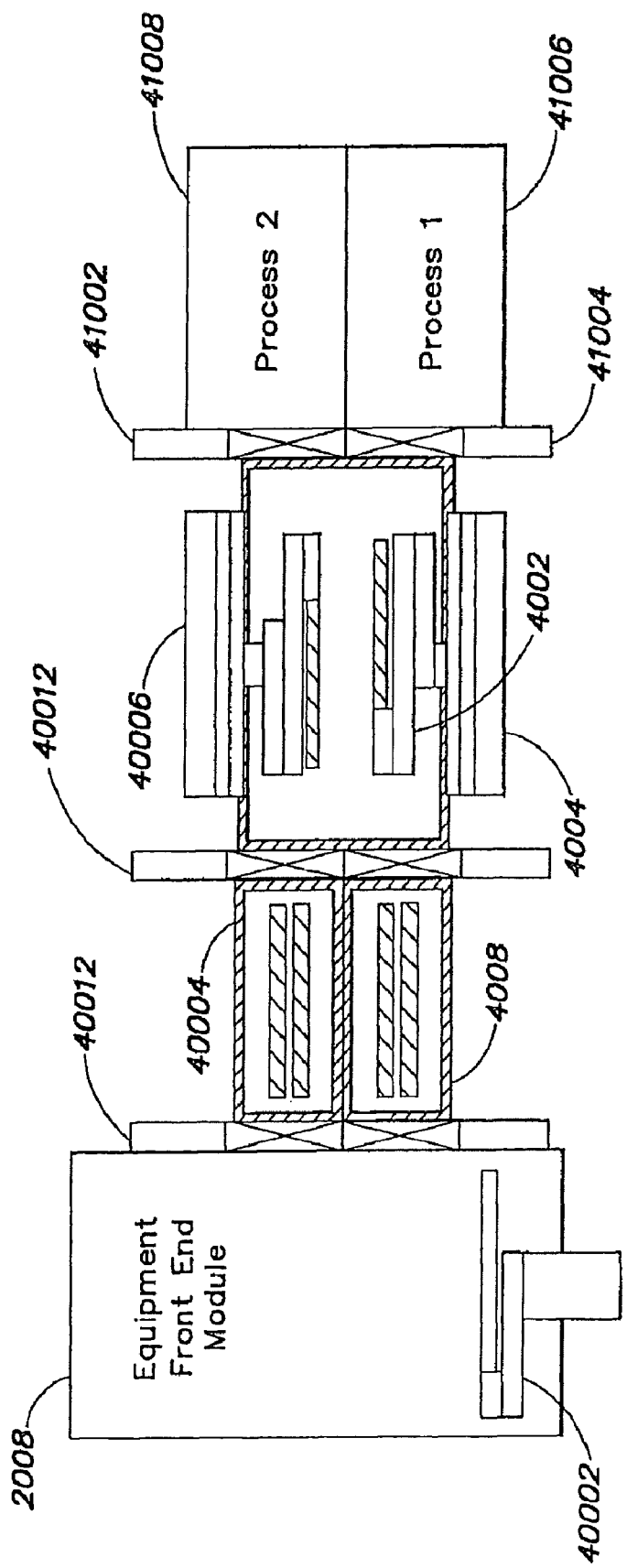
FIG. 26 shows a vertically arranged load lock and vertically stacked process modules in accordance with embodiments of the invention.

FIG. 26 details how the previous concept of stacked load locks 4008, 40004 can be also implemented throughout a process by stacking two process modules 41006, 41008. Although such modules would not be compliant with the SEMI standard, such an architecture may offer significant benefits in equipment footprint and throughput.

Figure 27:
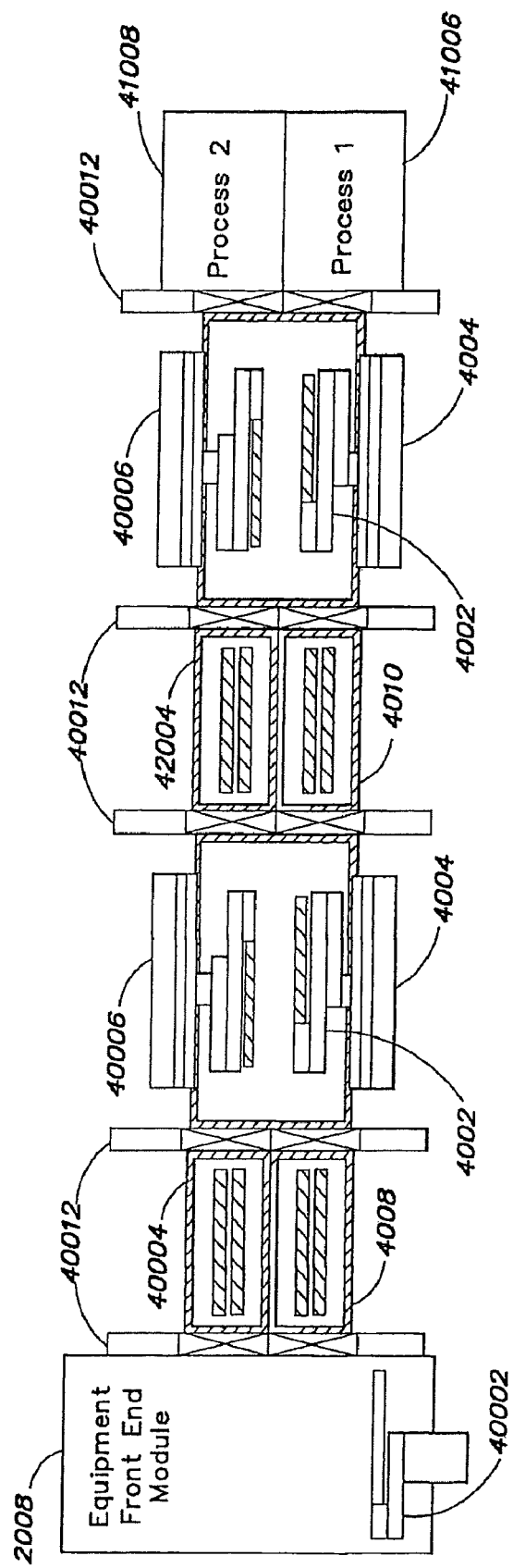
FIG. 27 shows a linearly arranged, two-level handling architecture with vertically stacked process modules in a cross-sectional side view in accordance with embodiments of the invention.

FIG. 27 shows a system with two handling levels 4008, 40004, 4010, 42004: wafers may be independently transported between modules using either the top link 40006 or the bottom link 4004. Optionally, each handling level may have two load locks to provide the advantage of reduced evacuation speed noted above. Thus a system with four input load locks, two handling levels, and optionally four output load locks, is also contemplated by description provided herein, as are systems with additional load lock and handling levels.

Figure 28:
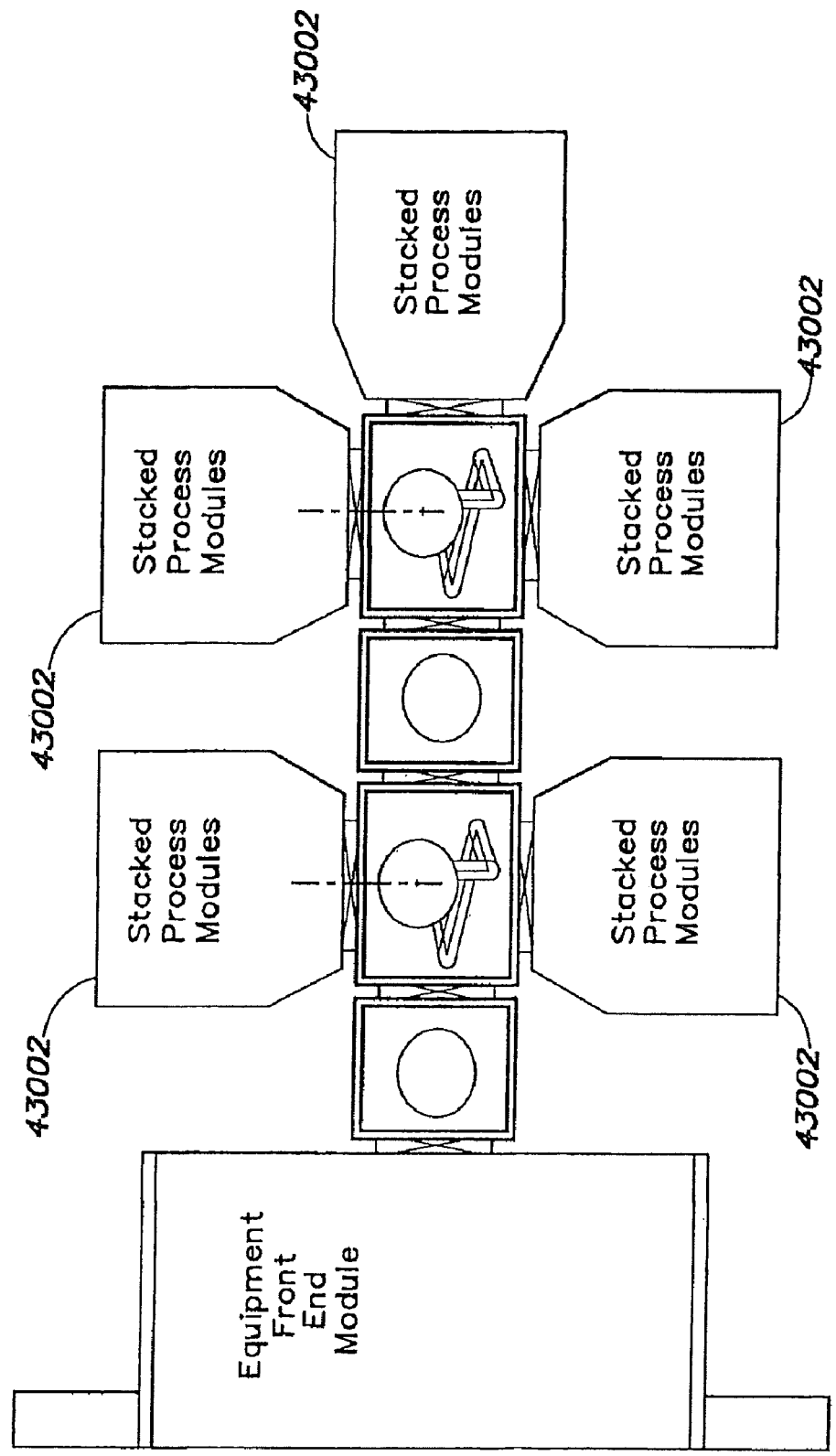
FIG. 28 shows the handling layout of FIG. 27 in a top view.

FIG. 28 shows a top view of the system of FIG. 27.

Figure 29:
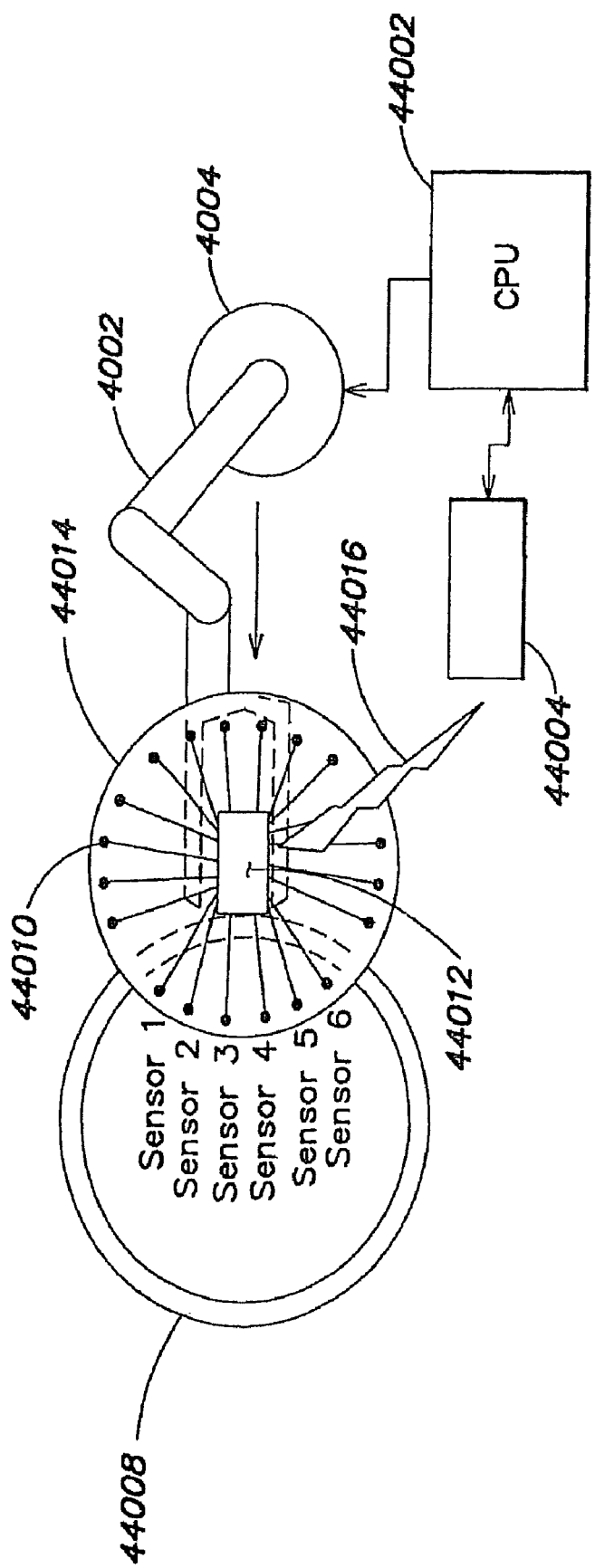
FIG. 29 shows an instrumented object on a robotic arm with sensors to detect proximity of the object to a target, in accordance with embodiments of the invention.

FIG. 29 depicts a special instrumented object 44014, such as a wafer. One or more sensors 44010 may be integrated into the object 44014, and may be able to detect environmental factors around the object 44014. The sensors 44010 may include proximity sensors such as capacitive, optical or magnetic proximity sensors. The sensors 44010 may be connected to an amplifier/transmitter 44012, which may use battery power to transmit radio frequency or other sensor signals, such as signals conforming to the 802.11b standard, to a receiver 44004.

In many instances it may be difficult or impossible to put instrumentation on an object 44014 used to train a robot, because the wires that are needed to power and communicate to the instruments and sensors interfere with proper robotic motion or with the environment that the robot moves through. By employing a wireless connection to the object, the problem of attached wires to the object may be resolved.

The object 44014 can be equipped with numerous sensors of different types and in different geometrically advantageous patterns. In the present example, the sensors 1 through 6 (44010) are laid out in a radius equal to the radius of the target object 44008. In embodiments these sensors are proximity sensors. By comparing the transient signals from the sensors 44010, for example sensor 1 and sensor 6, it can be determined if the object 44014 is approaching a target 44008 at the correct orientation. If the target 44008 is not approached correctly, one of the two sensors 44010 may show a premature trigger. By monitoring multiple sensors 440 10, the system may determine if the object 44010 is properly centered above the target 44008 before affecting a handoff. The sensors 44010 can be arranged in any pattern according to, for example, efficiency of signal analysis or any other constraints. Radio frequency signals also advantageously operate in a vacuum environment.

Figure 30:
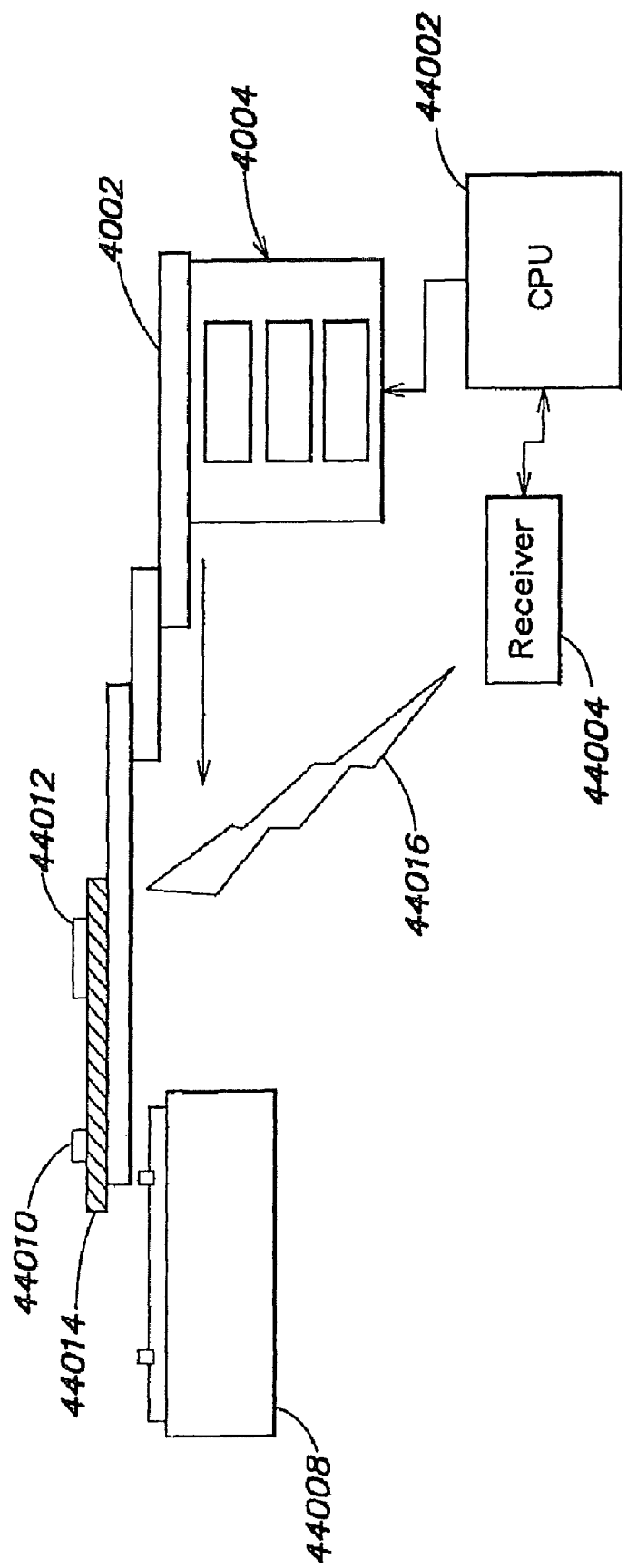
FIG. 30 illustrates how the movement of sensors over a target can allow the robotic arm to detect its position relative to the obstacle.

FIG. 30 shows the system of ,FIG. 29 in a side orientation illustrating the non-contact nature of orienting the instrumented object 44014 to a target 44008. The sensors 44010 may include other sensors for measuring properties of the target 44008, such as temperature.

Figure 31:
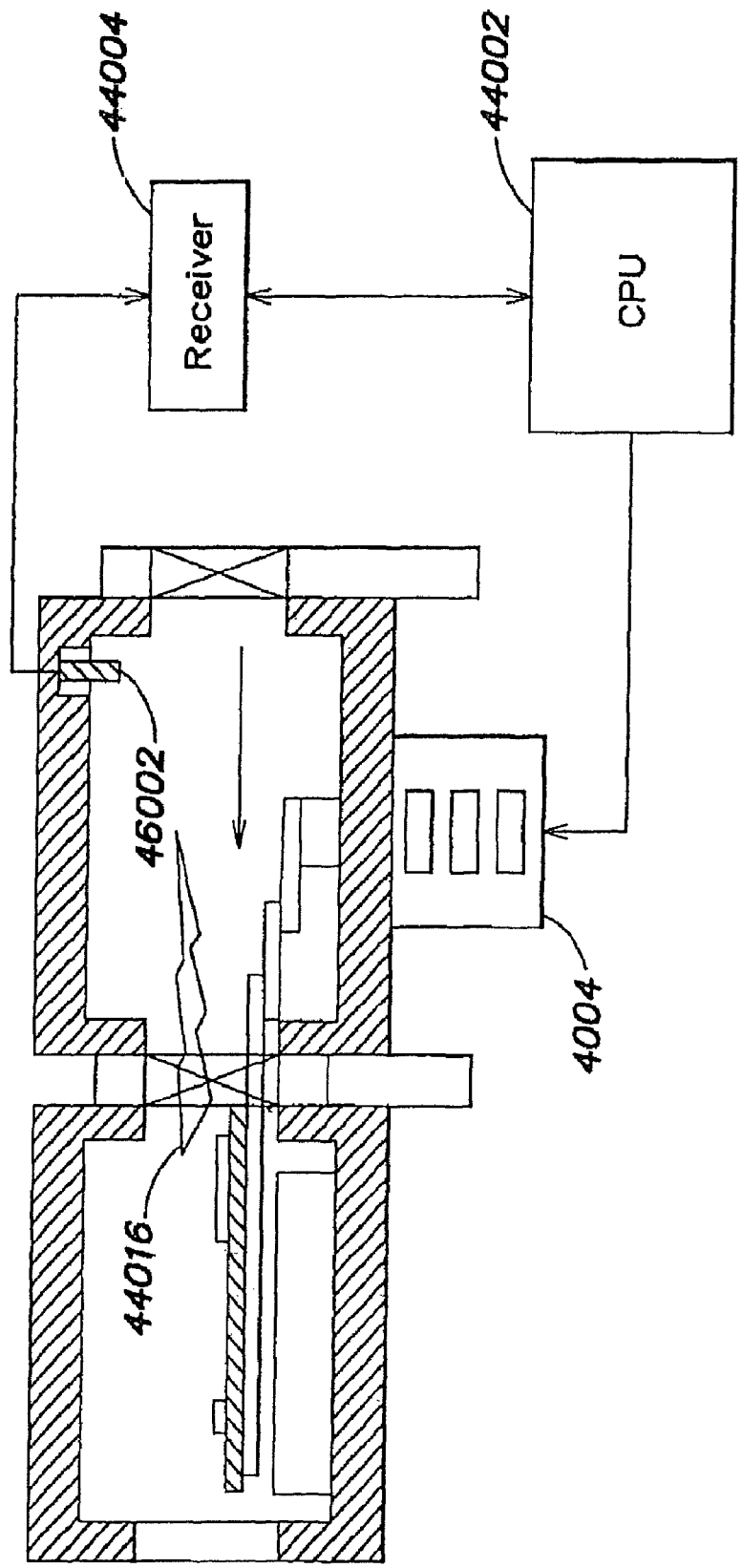
FIG. 31 shows how an instrumented object can use radio frequency communications in a vacuum environment to communicate position to a central controller.

FIG. 31 depicts radio frequency communication with one or more sensors. A radio frequency sensor signal 440 16 may be transmitted to an antenna 46002 within a vacuum. Appropriate selection of wavelengths may improve signal propagation with a fully metallic vacuum enclosure. The use of sensors in wireless communication with an external receiver and controller may provide significant advantages. For example, this technique may reduce the time required for operations such as finding the center of a target, and information from the sensor(s) may be employed to provide visual feedback to an operator, or to automate certain operations using a robotic arm. Furthermore, the use of one or more sensors may permit measurements within the chamber that would otherwise require release of the vacuum to open to atmosphere and physically inspect the chamber. This may avoid costly or time consuming steps in conditioning the interior of the chamber, such as depressurization and baking (to drive out moisture or water vapor).

Figure 32:
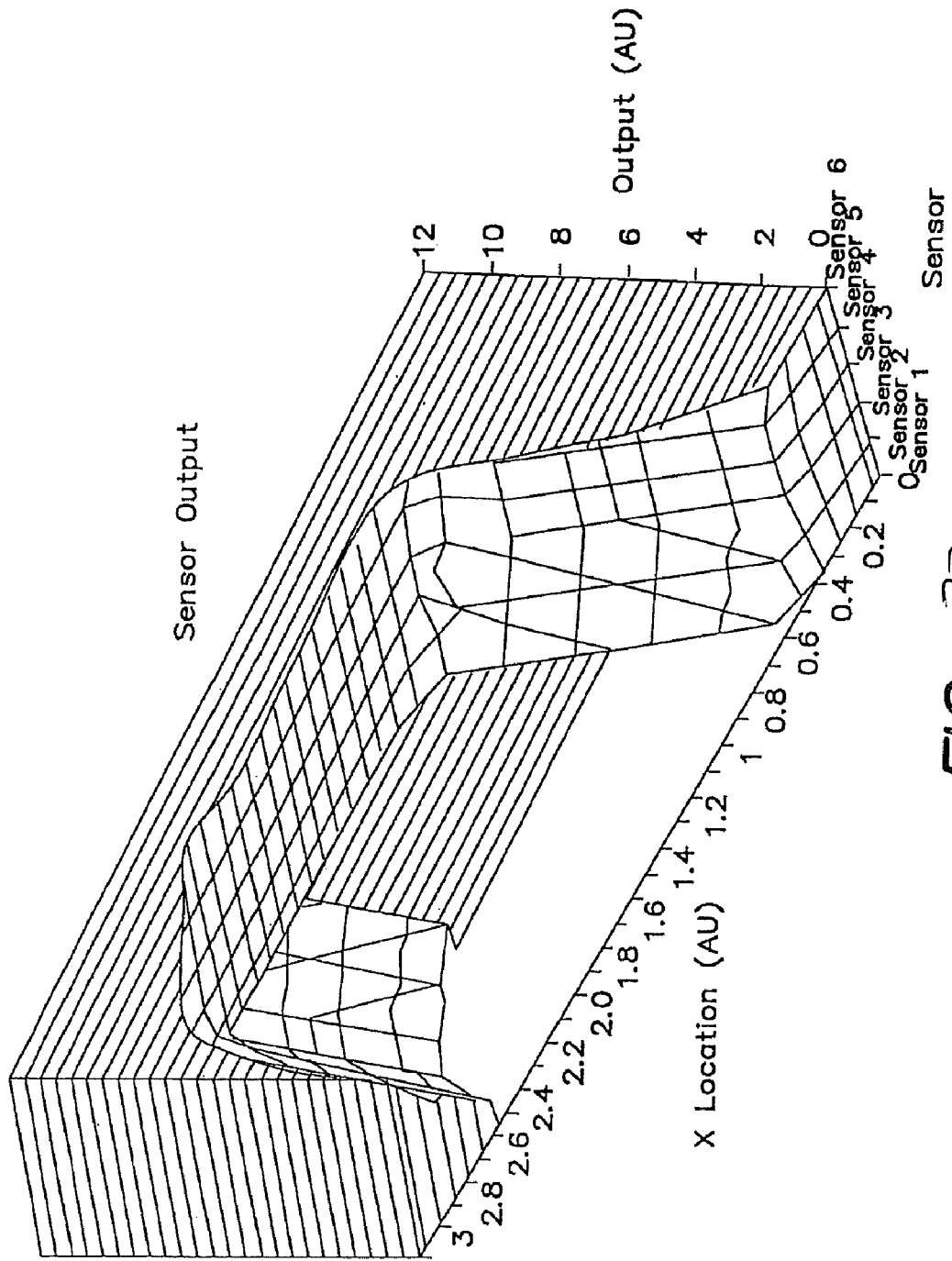
FIG. 32 illustrates the output of a series of sensors as a function of position.

FIG. 32 illustrates the output from multiple sensors 44010 as a function of the robot movement. When the robot moves over the target 44008 the motion may result in the sensors providing information about, for example, distance to the target 44008 if the sensors are proximity sensors. The signals can be individually or collectively analyzed to determine a location for the target 44008 relative to the sensors. Location or shape may be resolved in difference directions by moving the sensor(s) in two different directions and monitoring sensor signals, without physically contacting the target 44008.

Figure 33A:
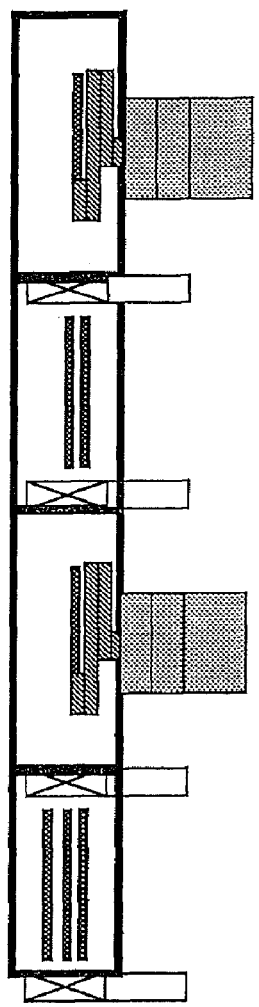
FIGS. 33A-33C show a multi-shelf buffer for use in a batch processing system.
Figure 33B:
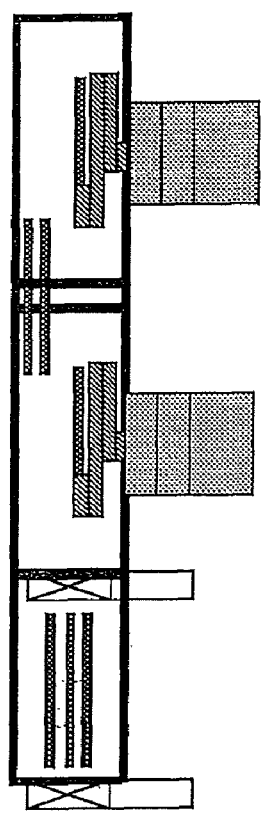
Figure 33C:
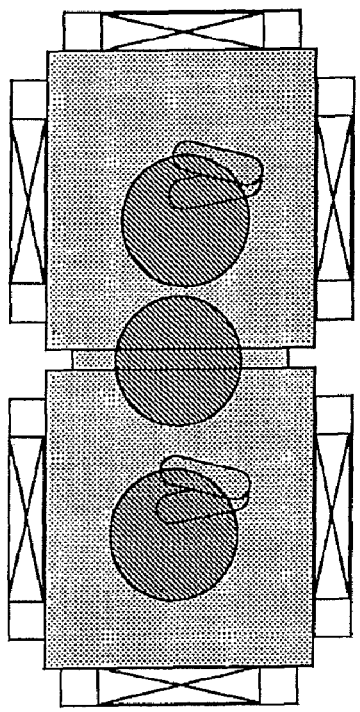

FIG. 33A-C illustrates how multiple transfer planes may be usefully employed to conserve floor space in a batch processing system. FIG. 33A shows a linking module including multiple transfer planes to accommodate single or multiple access to wafers within the linking module. Slot valves or the like are provided to isolate the linking module. FIG. 33B shows an alternative configuration in which multiple shelves are positioned between robots without isolation. In this configuration, the shelves may, for example, be positioned above the robots to permit a full range of robotic motion that might otherwise cause a collision between a robotic arm and wafers on the shelves. This configuration nonetheless provides batch processing and or multiple wafer buffering between robots. FIG. 33C shows a top view of the embodiment of FIG. 33B. As visible in FIG. 33C, the small adapter with shelves between robots in FIG. 33B permits relatively close positioning of two robots without requiring direct robot-to-robot handoffs. Instead each wafer or group of wafers can be transferred to the elevated shelves for subsequent retrieval by an adjacent robot. As a significant advantage, this layout reduces the footprint of two adjacent robots while reducing or eliminating the extra complexity of coordinating direct robot-to-robot handoffs.

Figure 34:
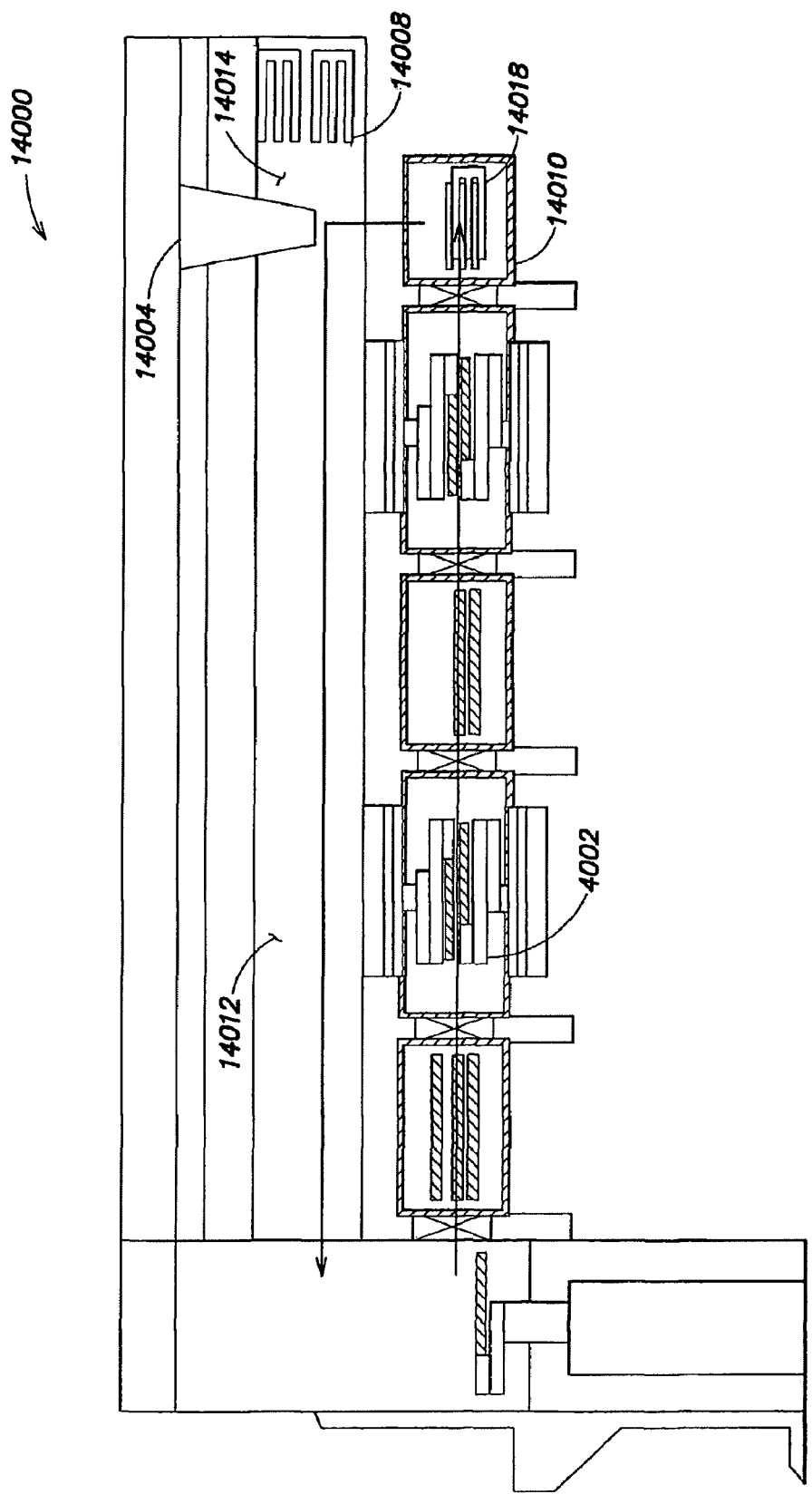
FIG. 34 shows an external return system for a handling system having a linear architecture.
Figure 34A:
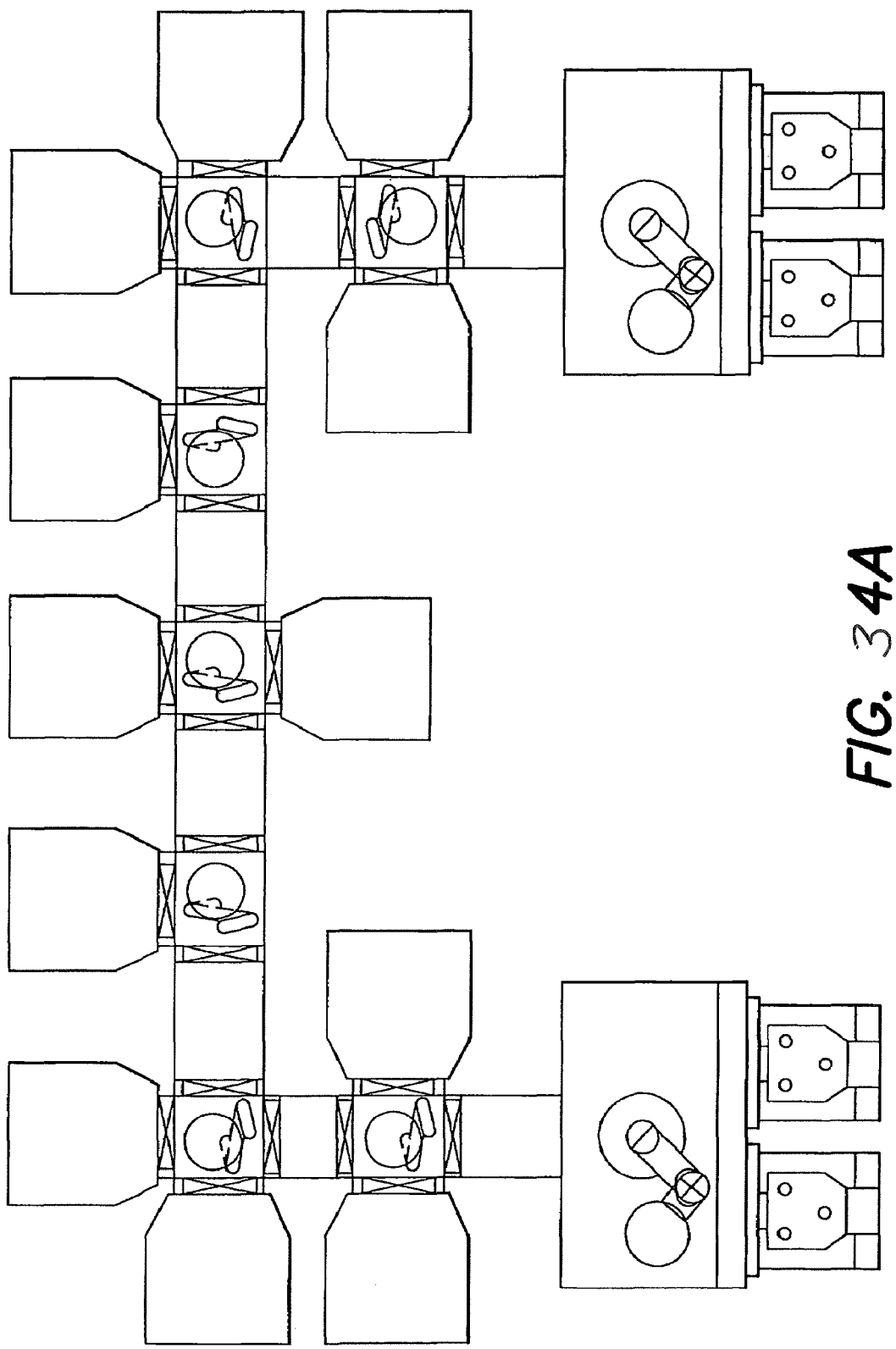
FIG. 34A shows a U-shaped configuration for a linear handling system.

FIG. 34 shows an external return system for a handling system having a linear architecture 14000. The return mechanism is optionally on the top of the linear vacuum chamber. On conventional vacuum handling systems, the return path is often through the same area as the entry path. This opens up the possibility of cross contamination, which occurs when clean wafers that are moving between process steps get contaminated by residuals entering the system from dirty wafers that are not yet cleaned. It also makes it necessary for the robot 4002 to handle materials going in as well as materials going out, and it makes it harder to control the vacuum environment. By exiting the vacuum system at the rear and moving the wafers on the top back to the front in an air tunnel 14012, there are some significant advantages: the air return may relatively cheap to implement; the air return may free up the vacuum robots 4002 because they do not have to handle materials going out; and the air return may keep clean finished materials out of the incoming areas, thereby lowering cross-contamination risks. Employing a small load lock 14010 in the rear may add some costs, and so may the air tunnel 14012, so in systems that are short and where vacuum levels and cross contamination are not so important, an air return may have less value, but in long systems with many integrated process steps the above-system air return could have significant benefits. The return system could also be a vacuum return, but that would be more expensive and more complicated to implement. It should be understood that while in some embodiments a load lock 14010 may be positioned at the end of a linear system, as depicted in FIG. 34, the load lock 14010 could be positioned elsewhere, such as in the middle of the system. In such an embodiment, a manufacturing item could enter or exit the system at such another point in the system, such as to exit the system into the air return. The advantage of a mid-system exit point may be that in case of a partial system failure, materials or wafers can be recovered. The advantage of a mid-system entry point may be that wafers can be inserted in multiple places in the system, allowing for a significantly more flexible process flow. In effect a mid system entry or exit position behaves like two machines connected together by the mid-system position, effectively eliminating an EFEM position. It should also be understood that while the embodiment of FIG. 34 and subsequent figures is a straight line system, the linear system could be curvilinear; that is, the system could have curves, a U- or V-shape, an S-shape, or a combination of those or any other curvilinear path, in whatever format the manufacturer desires, such as to fit the configuration of a fabrication facility. In each case the system optionally includes an entry point and an exit point that is down the line (although optionally not a straight line) from the entry point. Optionally the air return returns the item from the exit point to the entry point. Optionally the system can include more than one exit point. In each case the robotic arms described herein can assist in efficiently moving items down the line, without the problems of other linear systems. FIG. 34A shows an example of a U-shaped linear system.

Referring still to FIG. 34, an embodiment of the system uses a dual carrier mechanism 14008 so that wafers that are finished can quickly be returned to the front of the system, but also so that an empty carrier 14008 can be placed where a full one was just removed. In embodiments the air return will feature a carrier 14008 containing N wafers. N can be optimized depending on the throughput and cost requirements. In embodiments the air return mechanism may contain empty carriers 14008 so that when a full carrier 14018 is removed from the vacuum load lock 14010, a new empty carrier 14008 can immediately be placed and load lock 14010 can evacuated to receive more materials. In embodiments the air return mechanism may be able to move wafers to the front of the system. At the drop-off point a vertical lift 14004 may be employed to lower the carrier to a level where the EFEM (Equipment Front End Module) robot can reach. At the load lock point(s) the vertical lift 14004 can lower to pick an empty carrier 14008 from the load lock.

In embodiments the air return mechanism may feature a storage area 14014 for empty carriers 14008, probably located at the very end and behind the location of the load lock 14010. The reason for this is that when the load lock 14010 releaes a carrier 14018, the gripper 14004 can grip the carrier 14018 and move it forward slightly. The gripper 14004 can then release the full carrier 14018, move all the way back and retrieve an empty carrier 14008, place it on the load lock 14010. At this point the load lock 14010 can evacuate. The gripper 14004 can now go back to the full carrier 14018 and move it all the way to the front of the system. Once the carrier 14018 has been emptied by the EFEM, it can be returned to the very back where it waits for the next cycle.

It is also possible to put the lift in the load lock rather than using the vertical motion in the gripper, but that would be more costly. It would also be slightly less flexible. A manufacturer may want a vertical movement of the carrier 14018 in a few places, and putting it in the gripper 14004 would be more economical because the manufacturer then only needs one vertical mechanism.

Figure 35:
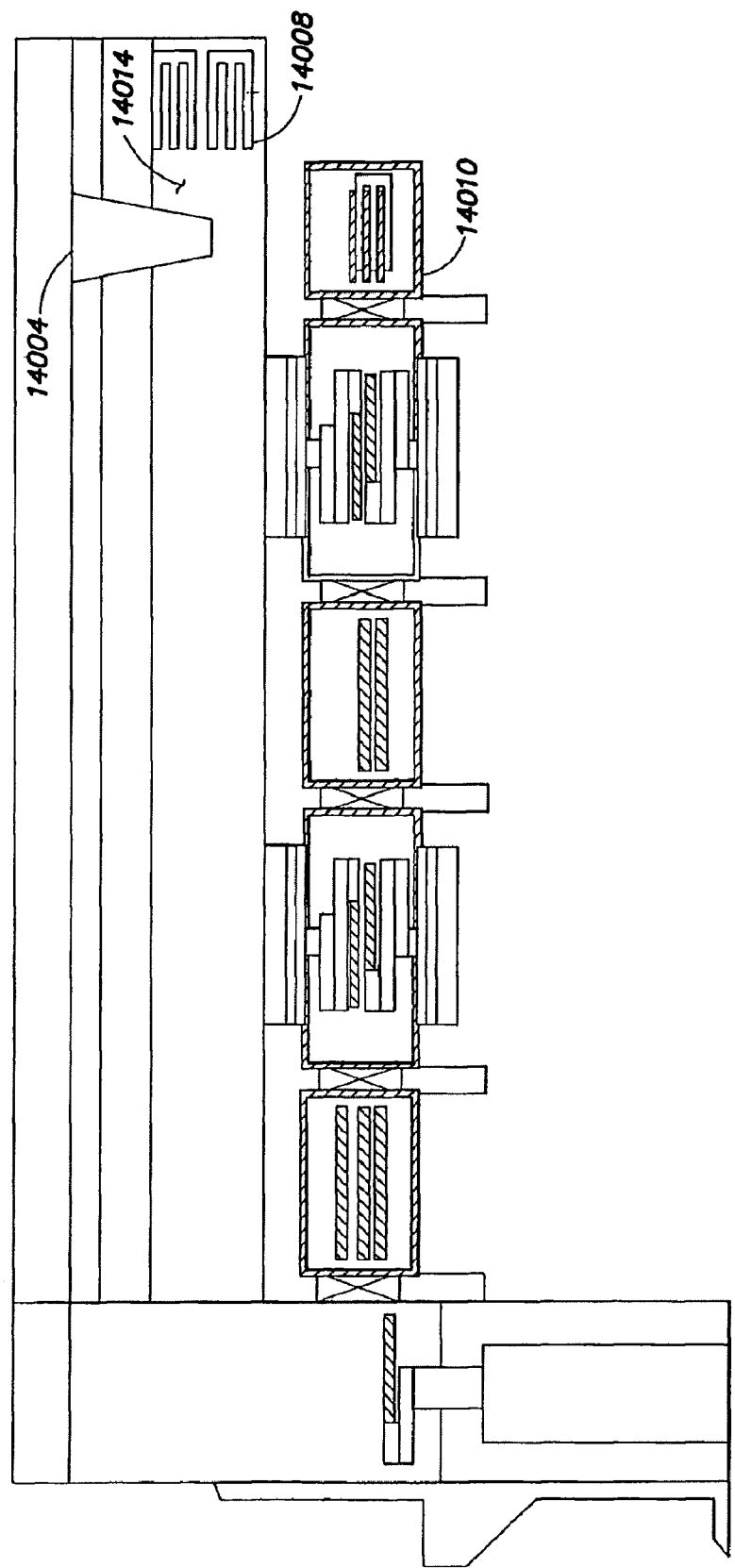
FIG. 35 shows certain details of an external return system for a handling system of FIG. 34.

FIG. 35 shows certain additional details of an external return system for a handling system of FIG. 34.

Figure 36:
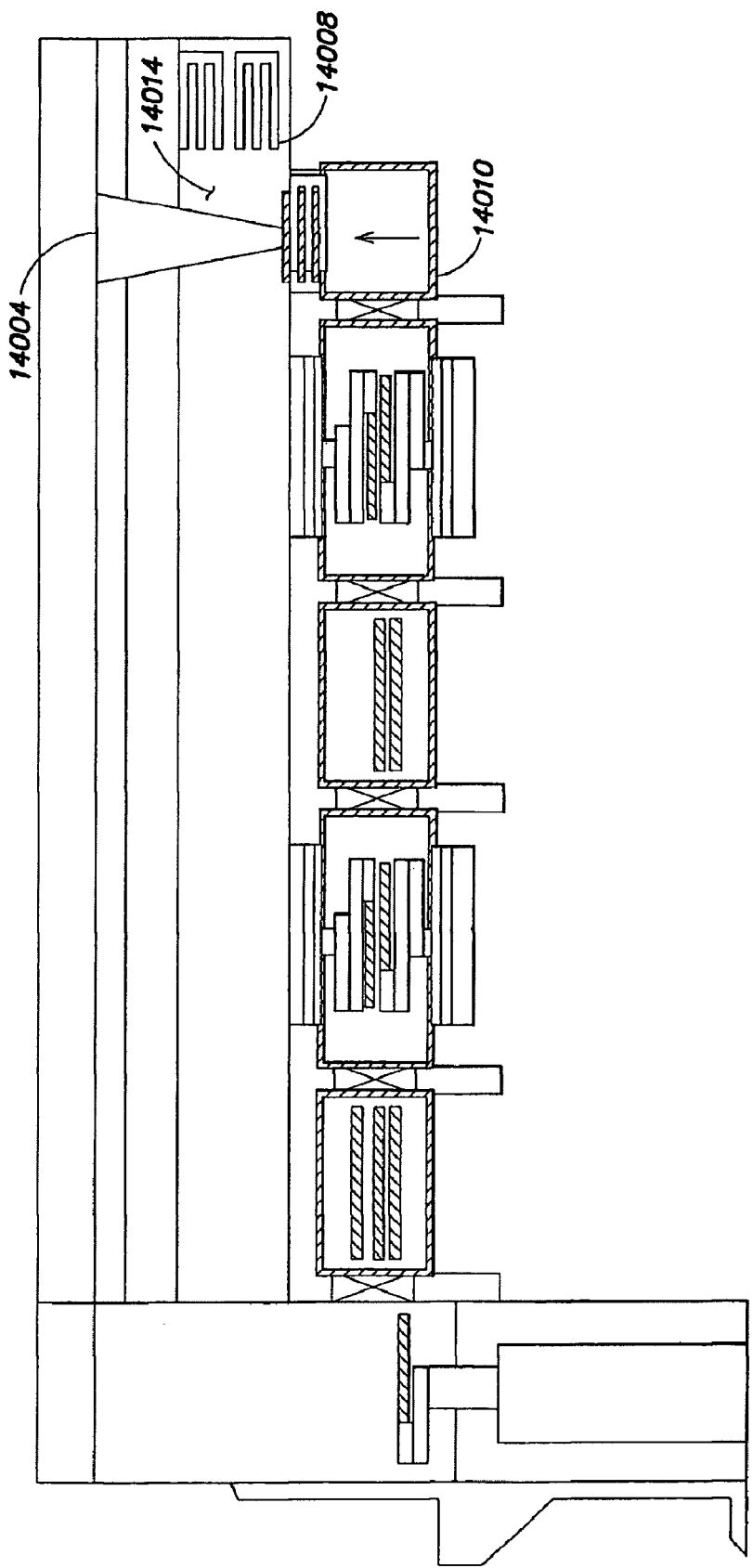
FIG. 36 shows additional details of an external return system for a handling system of FIG. 34.

FIG. 36 shows additional details of an external return system for a handling system of FIG. 34.

Figure 37:
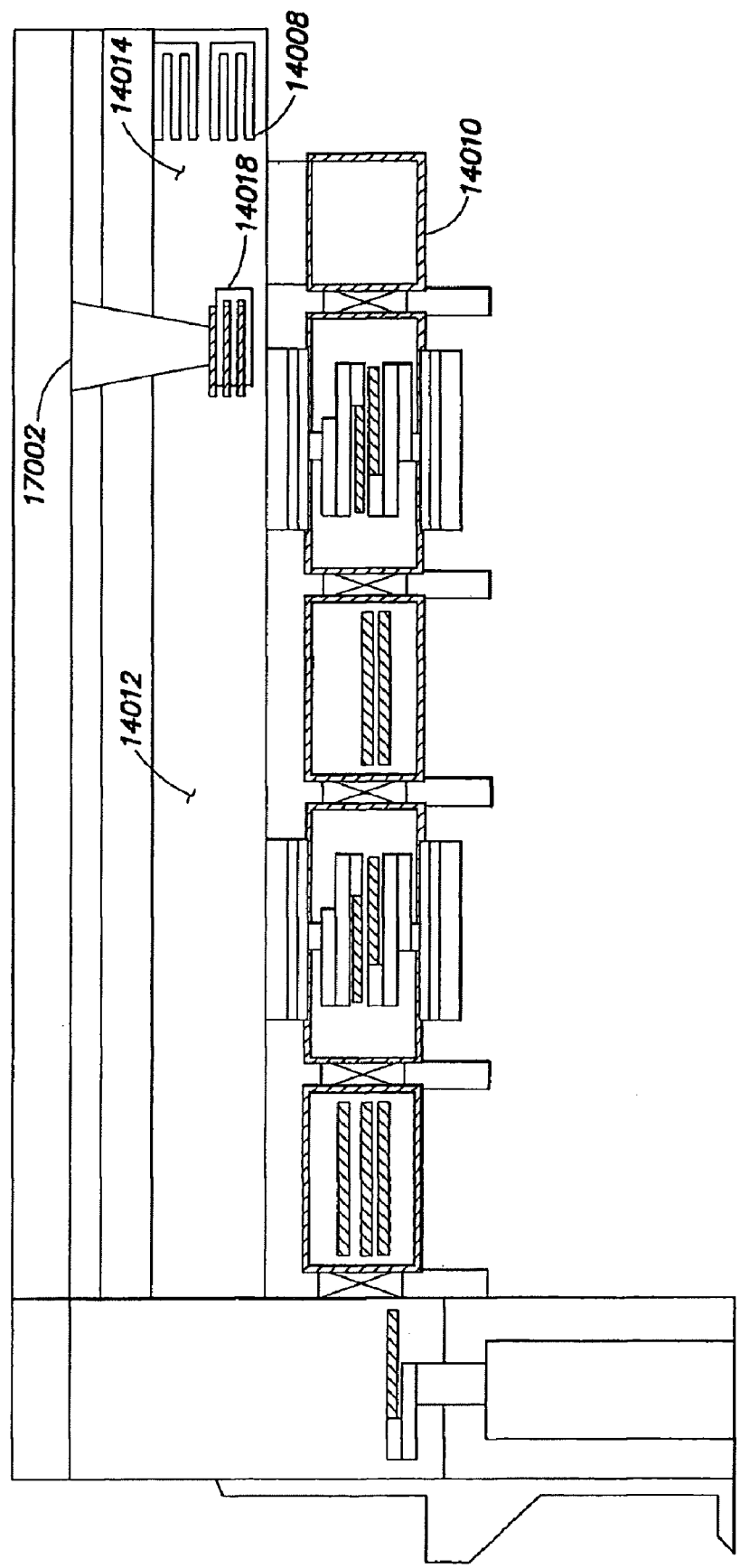
FIG. 37 shows movement of the output carrier in the return system of FIG. 34.

FIG. 37 shows movement of the output carrier 14018 in the return tunnel 14012 of FIG. 34. The gripper 14004 is shown in a position 17002 within the return tunnel 14012 away from the load lock 14010. Once in the return tunnel 14012 the gripper 14004 may move to any available position 17012 within the return tunnel 14012.

Figure 38:
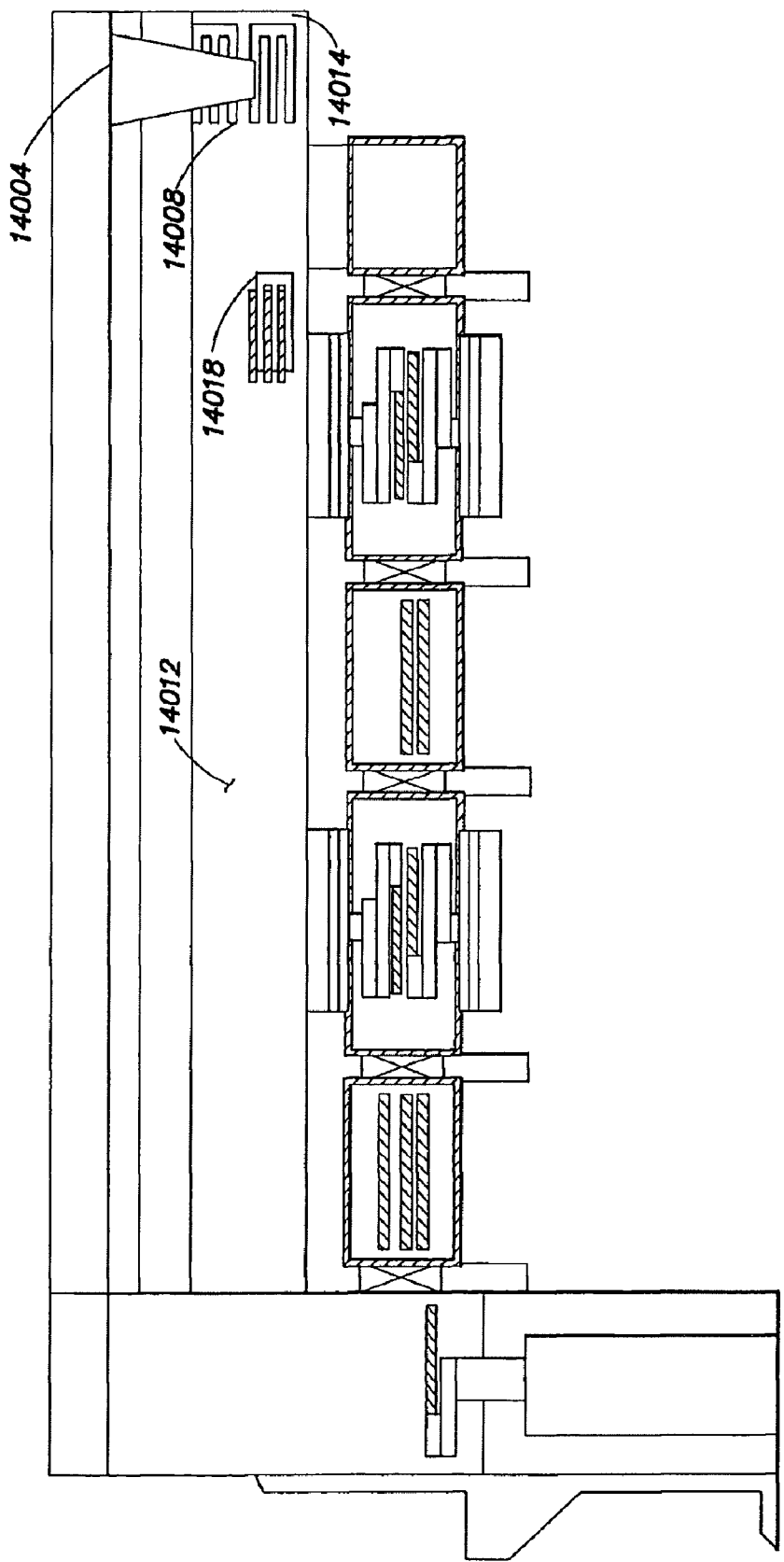
FIG. 38 shows handling of an empty carrier in the return system of FIG. 34.

FIG. 38 shows handling of an empty carrier 14008 in the return system 14012 of FIG. 34.

Figure 39:
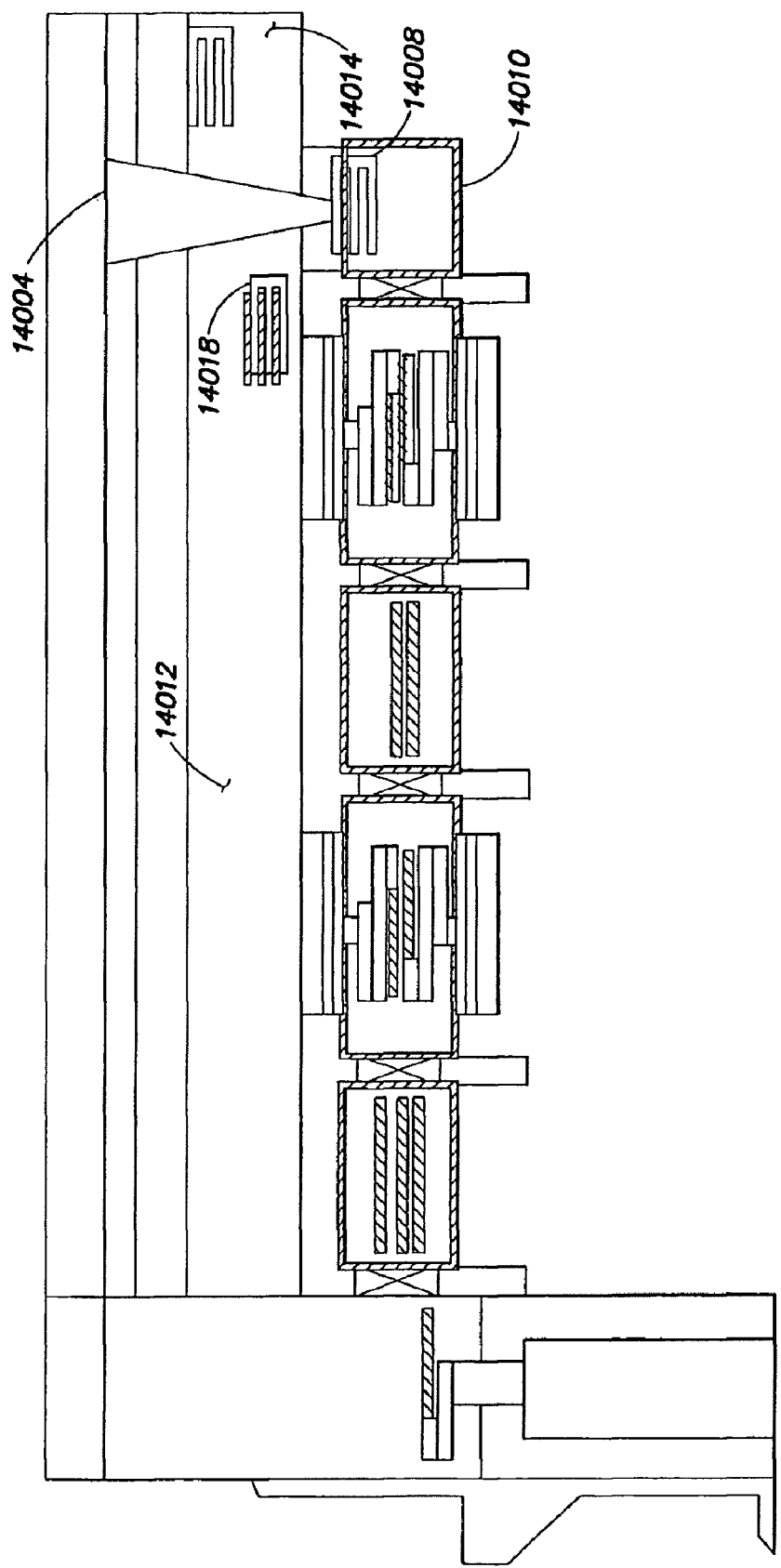

FIG. 39 shows movement of the empty carrier 14008 in the return tunnel 14012 of FIG. 34 into a load lock 14010 position.

Figure 40:
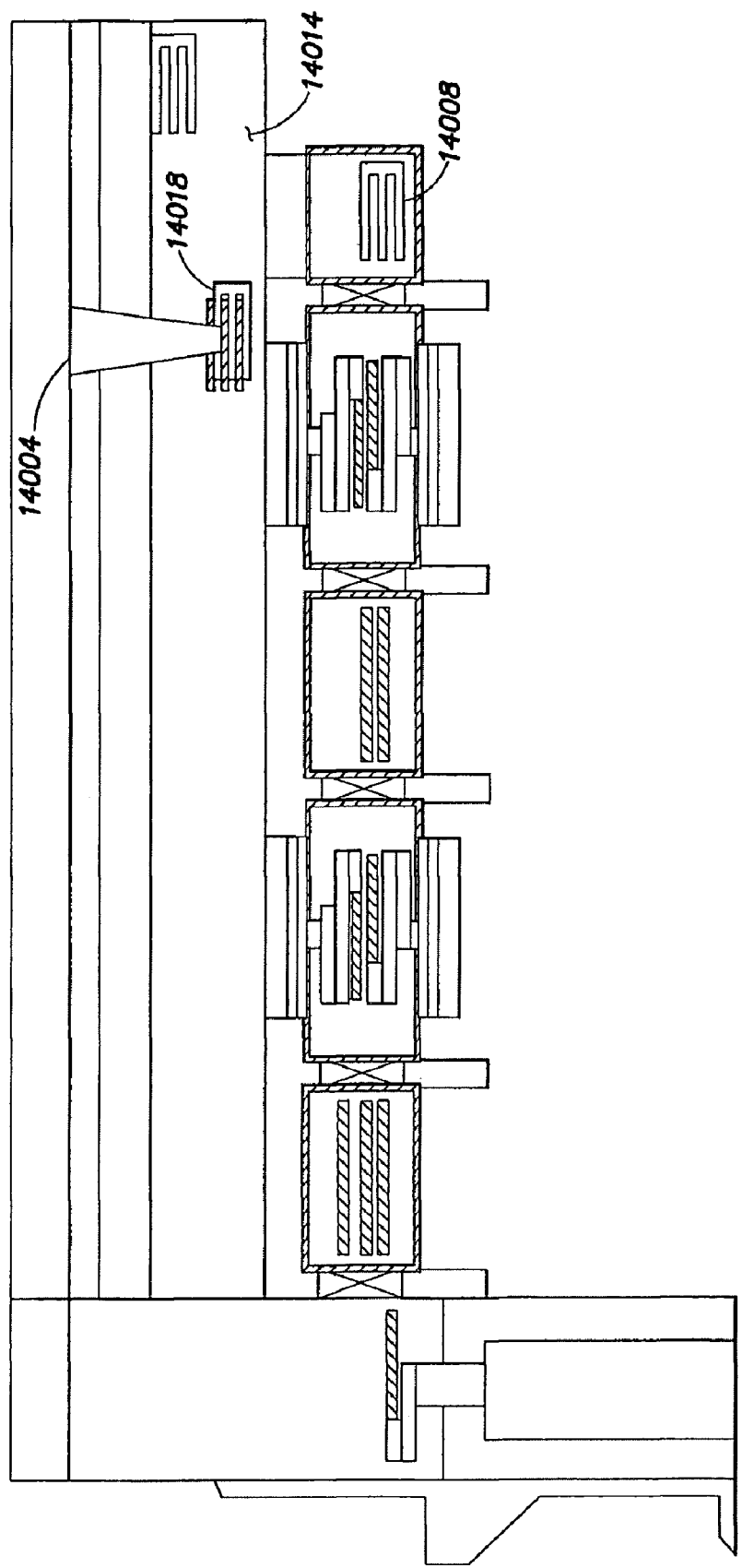
FIG. 40 shows the empty carrier lowered and evacuated and movement of the gripper in the return system of FIG. 34.

FIG. 40 shows the empty carrier 14008 lowered and evacuated and movement of the gripper 14004 in the return system of FIG. 34.

Figure 41:
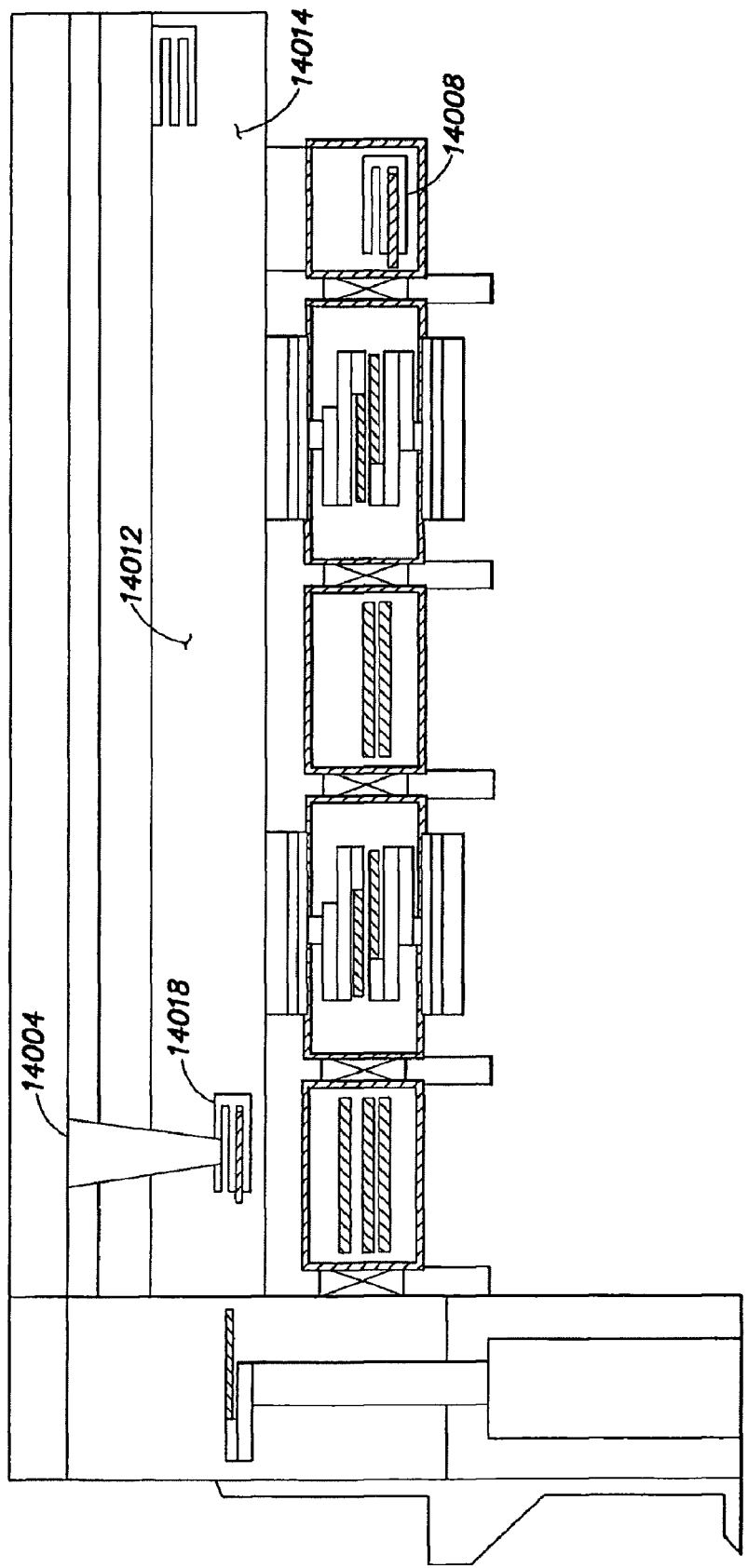
FIG. 41 shows an empty carrier receiving material as a full carrier is being emptied in the return system of FIG. 34.

FIG. 41 shows an empty carrier 14008 receiving material as a full carrier 14018 is being emptied in the return tunnel 14012 of FIG. 34.

Figure 42:
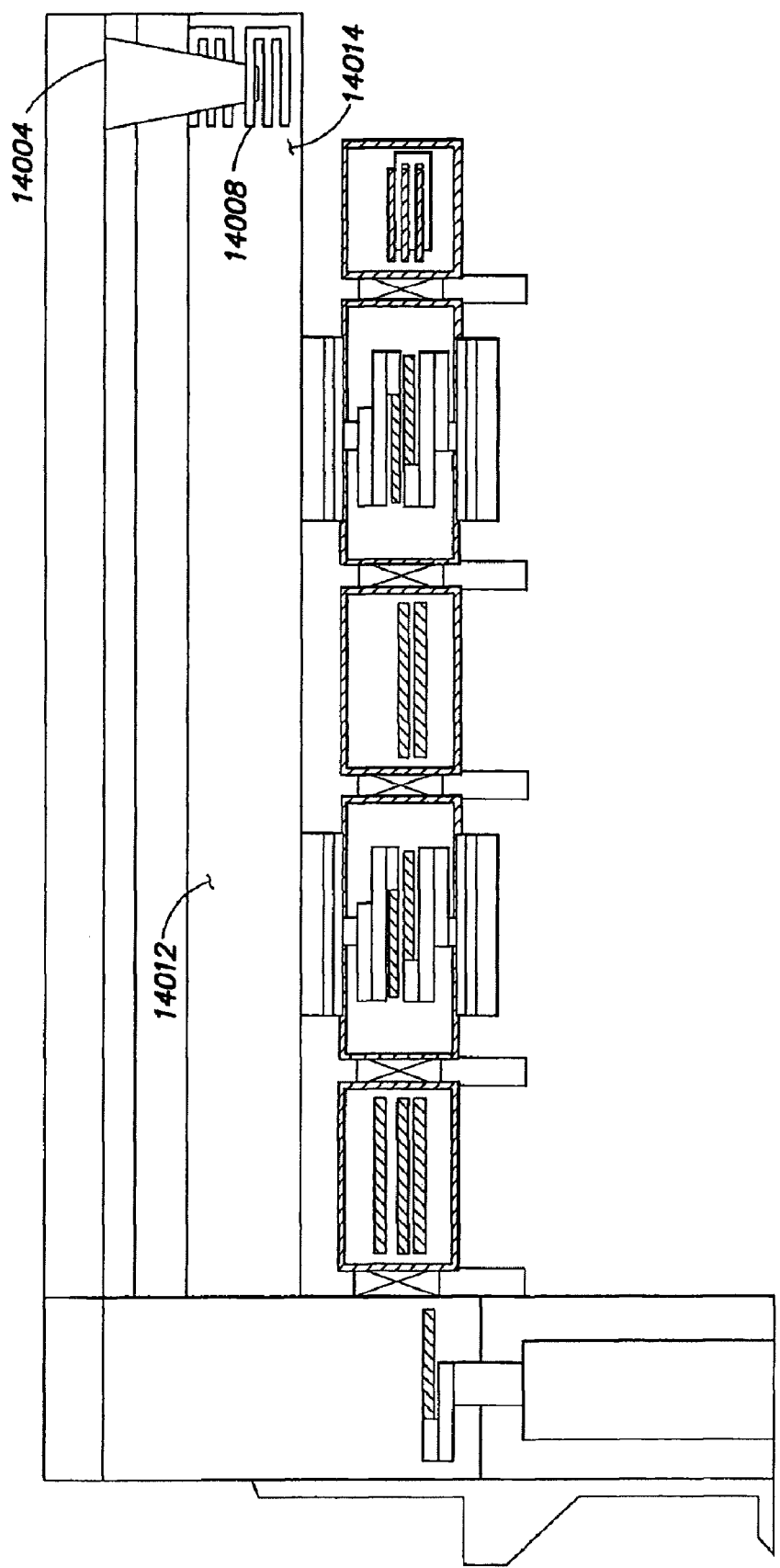
FIG. 42 shows an empty carrier brought to a holding position, starting a new return cycle in the return system of FIG. 34.

FIG. 42 shows an empty carrier 14008 brought to a holding position, starting a new return cycle in the return tunnel 14012 of FIG. 34.

Figure 43:
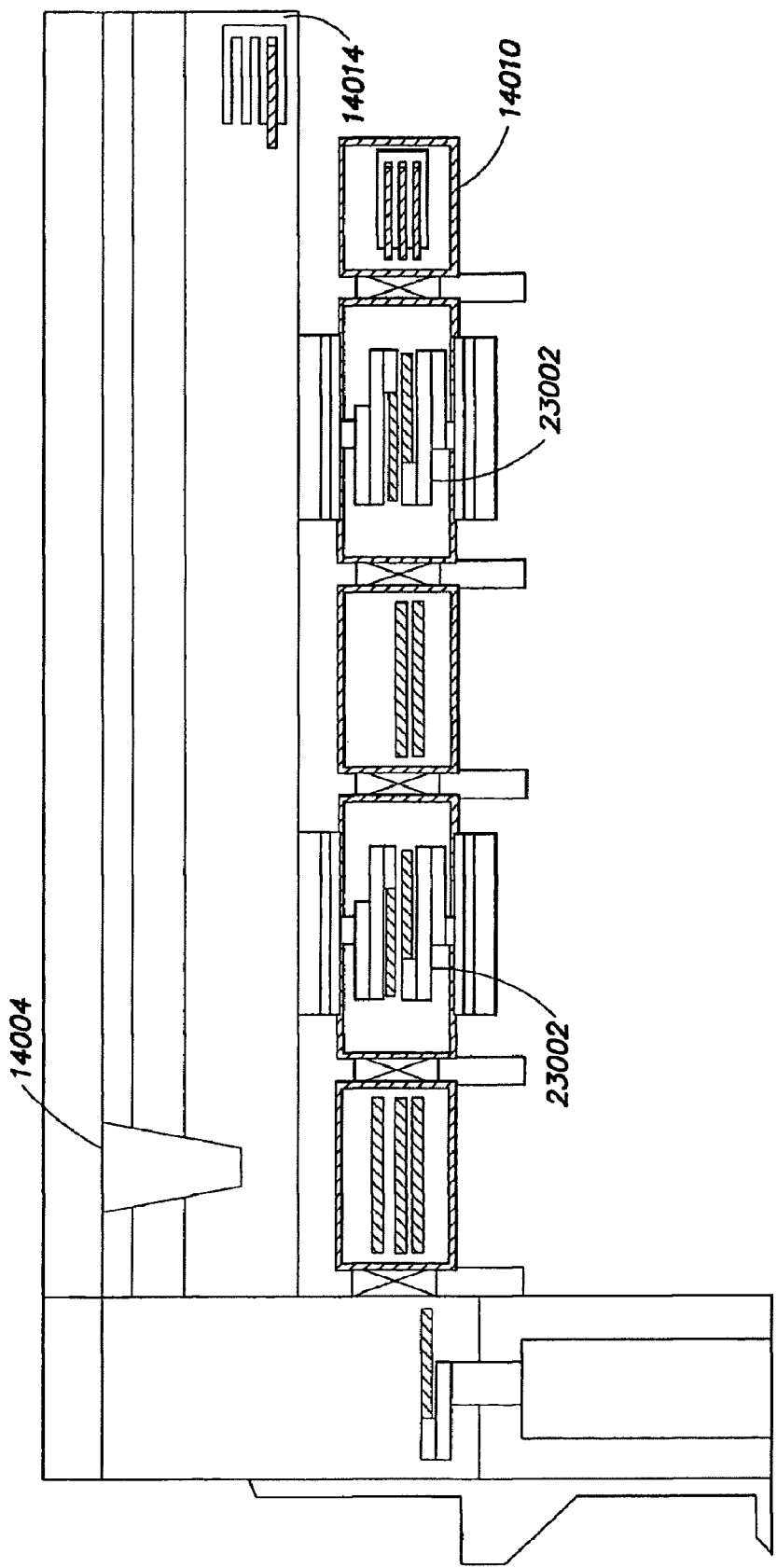
FIG. 43 shows an architecture for a handling facility for a manufacturing process, with a dual-arm robotic arm system and a return system in a linear architecture.

FIG. 43 shows an architecture for a handling facility for a manufacturing process, with a dual-arm robotic arm system 23002 and a return system in a linear architecture.

Figure 44:
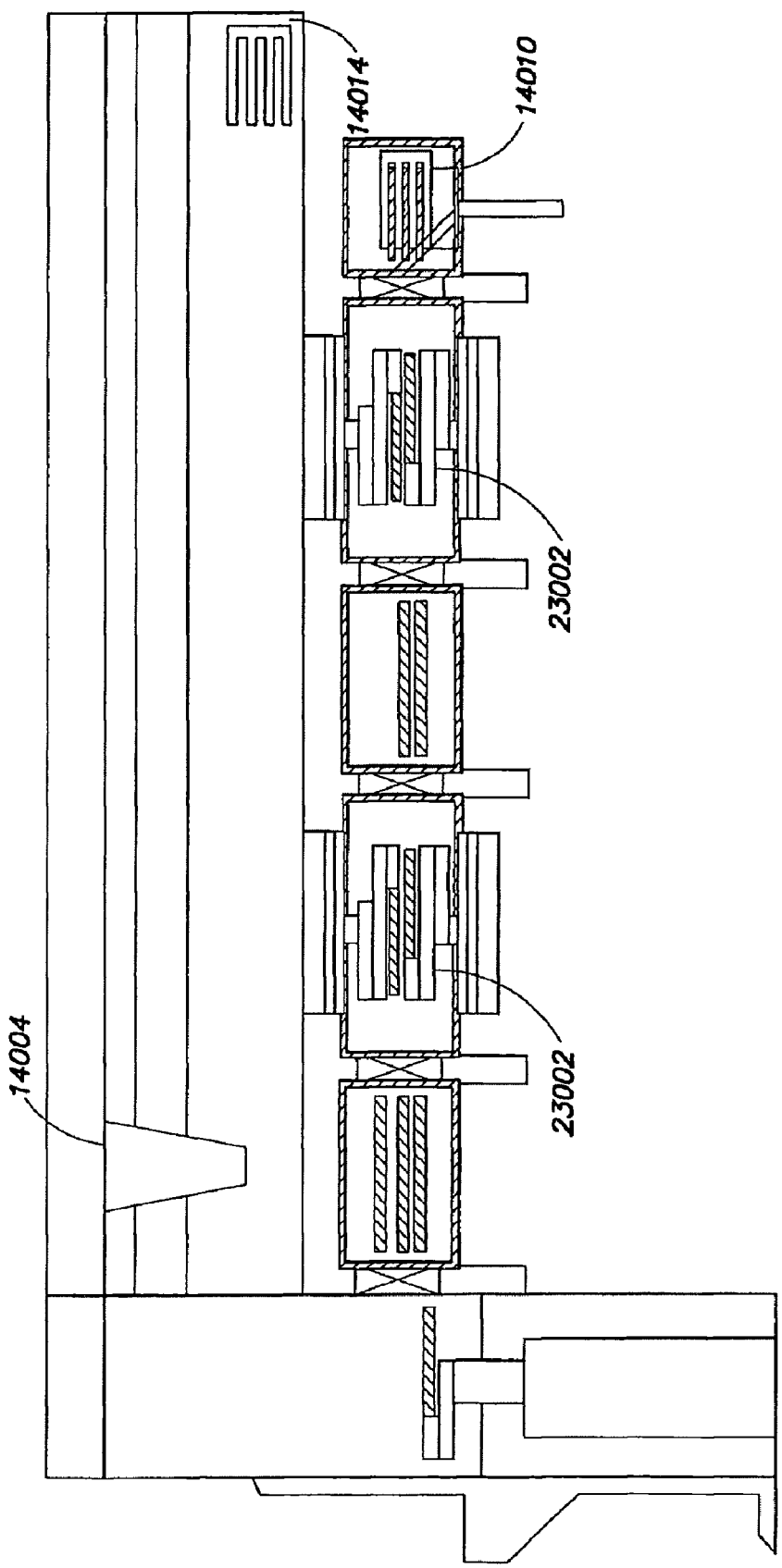
FIG. 44 shows an alternative embodiment of an overall system architecture for a handling method and system of the present invention.

FIG. 44 shows an alternative embodiment of an overall system architecture for a handling method and system of the present invention.

Figure 45:
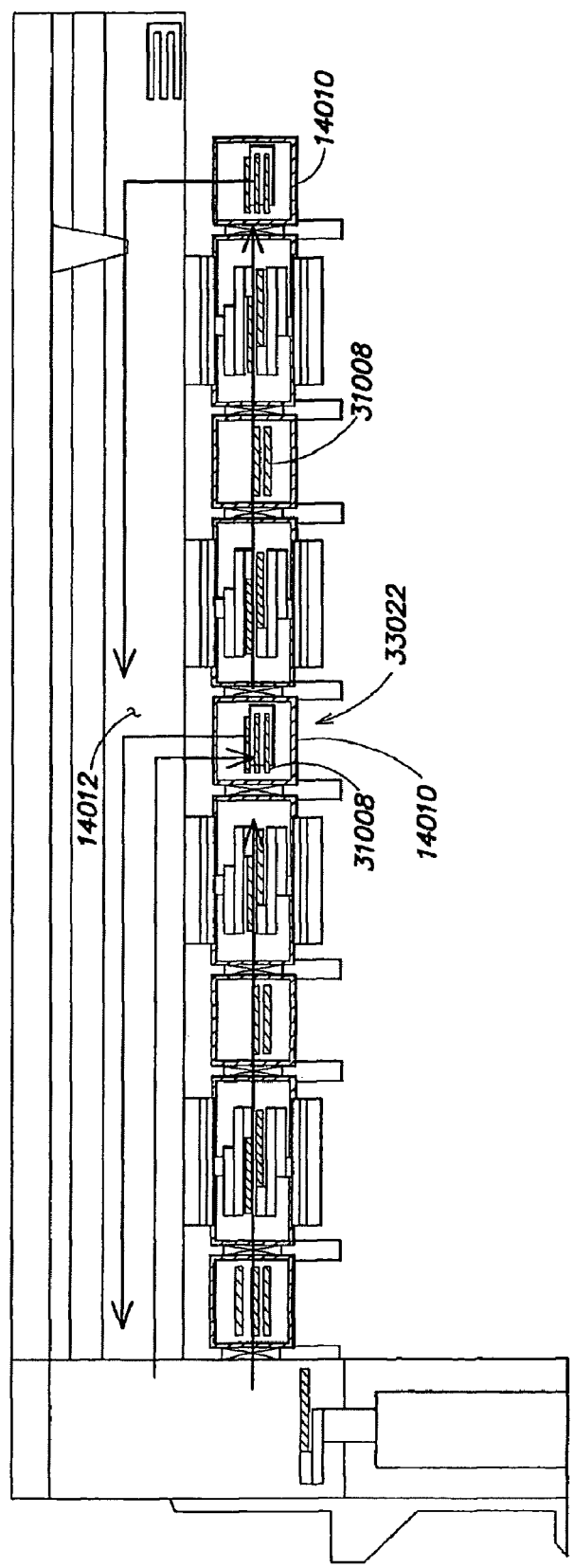
FIG. 45 illustrates a fabrication facility including a mid-entry facility.

FIG. 45 illustrates a fabrication facility including a mid-entry point 33022. In an embodiment, the fabrication facility may include a load lock 14010 mid-stream 33002 where wafers 31008 can be taken out or entered. There can be significant advantages to such a system, including providing a processing facility that provides dual processing capabilities (e.g. connecting two machines behind each other, but only need to use one EFEM). In an embodiment, the air return system 14012 can also take new wafers 31008 to the midpoint 33022 and enter wafers 31008 there.

It will be understood that, while specific modules and layouts are have been described in detail, these examples are not intended to be limiting, and all such variations and modifications as would be apparent to one of ordinary skill in the art are intended to fall within the scope of this disclosure. For example, while FIG. 12 depicts two robots in a shared common environment handling wafers for the modules 1202, a variety of other arrangements are possible. For example, all of the entries 1204 may be serviced by a single robot as described above with reference to FIG. 11, or the entries 1204 may be serviced by a pair of robots separated by an isolated buffer as described above with reference to FIG. 9. As another example, while numerous examples are provided above of dual entry or dual process modules, these concepts may be readily adapted to three entry or three process modules, or more generally, to any number of modules consistent with a particular fabrication facility or process.

Further, it should be understood that the devices disclosed herein may be combined in various ways within a semiconductor fabrication system, for example to form fabrication facilities adapted to balance processing load among relatively fast and relatively slow processes, or between processes amenable to batch processing and processes that are dedicated to a single wafer. Thus, while a number of specific combinations of modules are shown and described above, it will be appreciated that these combinations are provided by way of illustration and not by way of limitation, and that all combinations of the process modules disclosed herein that might usefully be employed in a semiconductor fabrication system are intended to fall within the scope of this disclosure.

More generally, it will be understood that, while various features of process modules are described herein by way of specific examples, that numerous combinations and variations of these features are possible and that, even where specific combinations are not illustrated or described in detail, all such combinations that might be usefully employed in a semiconductor manufacturing environment are intended to fall within the scope of this disclosure.

What is claimed is:

1. A method comprising:
providing a pair of vertically stacked load locks;
providing at least two workpiece handling robotic facilities positioned on different sides of the pair of vertically stacked load locks and connected to the pair of vertically stacked load locks to form a vacuum handling system having a vacuum environment therein for transferring workpieces between the pair of vertically stacked load locks; and
delivering a workpiece between the pair of vertically stacked load locks with an air-based workpiece delivery system, where the air-based workpiece delivery system provides transfer of workpieces between the pair of vertically stacked load locks and is isolated from the vacuum handling system.

2. The method of claim 1, further including adding at least one of a semiconductor processing module and a wafer handling robotic facility to the vacuum handling system without reconfiguring existing components of the vacuum handling system.

3. The method of claim 1, further including configuring the at least two workpiece handling robotic facilities in the vacuum handling system to facilitate sequential processing of a workpiece by a first robot handing off the workpiece to a second robot between two sequential processes.

4. The method of claim 1, wherein at least one of the robotic handling facilities includes a plurality of modular interfaces that each supports connection to other workpiece handling modules to extend the vacuum environment.

5. The method of claim 1, further including detecting a module that is connected to the vacuum handling system and causing control software associated with the connected module to be operationally linked to system control software associated with the vacuum handling system.

6. The method of claim 1, further including providing a module connected to the vacuum handling system that includes wafer storage features that are accessible by at least one robotic handling facility.

7. The method of claim 1, wherein the vacuum handling system includes at least two different wafer processing modules for performing a process, the process selected from a list consisting of chemical vapor deposition, physical vapor deposition, etching, plasma processing, lithography, plating, cleaning, and spin coating.

8. A semiconductor handling system comprising:
a vacuum workpiece handling system having a vacuum environment therein, the vacuum workpiece handling system including at least two workpiece handling robotic facilities and a pair of vertically stacked load locks positioned between the at least two workpiece handling robotic facilities, the at least two workpiece handling robotic facilities being configured to transfer workpieces between the pair of vertically stacked load locks; and
an air-based workpiece delivery system for transporting a workpiece between the pair of vertically stacked load locks, the air-based workpiece delivery system being isolated from the vacuum workpiece handling system.

9. The system of claim 8, further including a load lock wherein at least one of the at least two workpiece handling robotic facilities is disposed between the load lock and the pair of vertically stacked load locks.

10. The system of claim 9, wherein the air-based workpiece delivery system is adapted to transport a workpiece between at least one of the pair of vertically stacked load locks and the load lock.

11. The system of claim 8, wherein at least one of a semiconductor processing module and a wafer handling robotic facility can be added to the semiconductor handling system without reconfiguring existing components of the vacuum workpiece handling system.

12. The system of claim 8, wherein at least one of the robotic handling facilities includes a plurality of modular interfaces that each supports connection to other workpiece handling modules to extend the vacuum environment.

13. The system of claim 8, further including module control software that is operationally linked to system control software associated with the vacuum system when a connection between a module and the vacuum system is detected.

14. The system of claim 8, further including a module connected to the vacuum handling system that includes wafer storage features that are accessible by at least one robotic handling facility.

15. The system of claim 8, wherein the vacuum handling system includes at least two different wafer processing modules selected from a list consisting of standard width, double width, stretch width, sub chamber divided, batch process, double sided entry, and scanning electron microscope.

* * * * *

UNITED STATES PATENT AND TRADEMARK OFFICE
CERTIFICATE OF CORRECTION

| | |
|---|---|
| PATENT NO. | : 8,313,277 B2 |
| APPLICATION NO. | : 11/876915 |
| DATED | : November 20, 2012 |
| INVENTOR(S) | : van der Meulen et al. |

It is certified that error appears in the above-identified patent and that said Letters Patent is hereby corrected as shown below:

In the Specifications:

Column 1, line 7, delete "continuation-in-part" and insert --continuation-- therefor.

Column 1, line 9, delete "which" and insert --which is a-- therefor.

Signed and Sealed this
Fourth Day of June, 2013

Teresa Stanek Rea
*Acting Director of the United States Patent and Trademark Office*